US007877719B2

(12) United States Patent
He

(10) Patent No.: US 7,877,719 B2
(45) Date of Patent: Jan. 25, 2011

(54) FAST DUAL-$V_{dd}$ BUFFER INSERTION AND BUFFERED TREE CONSTRUCTION FOR POWER MINIMIZATION

(75) Inventor: Lei He, Pasadena, CA (US)

(73) Assignee: The Regents of the University of California, Oakland, CA (US)

( * ) Notice: Subject to any disclaimer, the term of this patent is extended or adjusted under 35 U.S.C. 154(b) by 515 days.

(21) Appl. No.: 11/953,175

(22) Filed: Dec. 10, 2007

(65) Prior Publication Data

US 2008/0141206 A1 Jun. 12, 2008

Related U.S. Application Data

(63) Continuation of application No. PCT/US2006/022543, filed on Jun. 9, 2006.

(60) Provisional application No. 60/689,594, filed on Jun. 10, 2005.

(51) Int. Cl.
*G06F 17/50* (2006.01)
*H03K 17/16* (2006.01)
*H03K 19/003* (2006.01)
*H01L 25/00* (2006.01)

(52) U.S. Cl. ............................... 716/9; 716/10; 716/13; 716/14; 326/31; 326/41; 326/101

(58) Field of Classification Search ..................... 716/9, 716/10, 13, 14; 326/31, 41, 101
See application file for complete search history.

(56) References Cited

U.S. PATENT DOCUMENTS 5,235,521 A 8/1993 Johnson et al.
6,560,752 B1 5/2003 Alpert et al.
7,127,696 B2 * 10/2006 Alpert et al. .................. 716/10
2004/0064793 A1 4/2004 Alpert et al.

OTHER PUBLICATIONS

B. Amelifard et al. Low power fanout optimization using multiple threshold voltage inverters. Proceedings of the 2005 International Symposium on Low Power Electronics and Design, Aug. 8, 2005, pp. 95-98.
J. Pangjun et al. Clock distribution multiple voltages. 1999 International Symposium on Low Power Electronics and Design, 1999, pp. 145-150.
K.H. Tam et al. Power optimal dual-V/sub dd/ buffered tree considering buffer stations and blockages. Proceedings of 42nd Design Automation Conference, Jun. 13, 2005, pp. 497-502.
A. Vittal et al. Low-power buffered clock tree design. IEEE Transactions on Computer-Aided Design of Integrated Circuits and Systems, vol. 6, No. 9, Sep. 1997, pp. 965-975.

* cited by examiner

*Primary Examiner*—Phallaka Kik
(74) *Attorney, Agent, or Firm*—John P. O'Banion

(57) ABSTRACT

Integrated circuit apparatus and methods are described for inserting multi-$V_{dd}$ buffers within an interconnection tree during routing toward minimization of power under a delay constraint. Insertion of level converters is not necessary within the routing trees of the interconnect tree despite the insertion of the multi-$V_{dd}$ buffers. Techniques are described for controlling the dramatic complexity increment due to simultaneous delay and power consideration and increased buffer choices. Overhead reduction techniques are taught including: sampling based techniques, prediction based pruning techniques (PSP) and (PMP), and escape grid reduction, each of which are directed to multi-$V_{dd}$ buffer insertion. The resultant integrated circuits are routed with substantial power reductions over conventional routing.

20 Claims, 15 Drawing Sheets

FAST DUAL-$V_{dd}$ BUFFER INSERTION AND BUFFERED TREE CONSTRUCTION FOR POWER MINIMIZATION

CROSS-REFERENCE TO RELATED APPLICATIONS

This application claims priority from, and is a 35 U.S.C. §111(a) continuation of, co-pending PCT international application serial number PCT/US2006/022543, filed on Jun. 9, 2006, incorporated herein by reference in its entirety, which claims priority from U.S. provisional application Ser. No. 60/689,594, filed on Jun. 10, 2005, incorporated herein by reference in its entirety.

STATEMENT REGARDING FEDERALLY SPONSORED RESEARCH OR DEVELOPMENT

This invention was made with Government support under Grant No. 0401682 awarded by the National Science Foundation. The Government has certain rights in this invention.

This application is related to PCT International Publication No. WO 2006/135780, published in Dec. 21, 2006, incorporated herein by reference in its entirety.

NOTICE OF MATERIAL SUBJECT TO COPYRIGHT PROTECTION

A portion of the material in this patent document is subject to copyright protection under the copyright laws of the United States and of other countries. The owner of the copyright rights has no objection to the facsimile reproduction by anyone of the patent document or the patent disclosure, as it appears in the United States Patent and Trademark Office publicly available file or records, but otherwise reserves all copyright rights whatsoever. The copyright owner does not hereby waive any of its rights to have this patent document maintained in secrecy, including without limitation its rights pursuant to 37 C.F.R. §1.14.

BACKGROUND OF THE INVENTION

1. Field of the Invention

This invention pertains generally to integrated circuit fabrication, and more particularly to power minimization including power minimization within Dual-$V_{dd}$ buffer circuitry.

2. Description of Related Art

As VLSI circuits are aggressively scaled down, the interconnections have become performance bottlenecks. Buffer insertion is extensively relied-upon to reduce interconnect delay at the expense of increased power dissipation. In order to address this problem, one researcher presented a dynamic programming based algorithm for delay-optimal buffer insertion. (Refer to article from L. P. P. P. van Ginneken, "Buffer Placement In Distributed RC-Tree Networks For Minimal Elmore Delay", printed in proceedings of IEEE Int. Symp. on Circuits and Systems, pp. 865.868, 1990.) Given a routing tree, partial solutions in each tree node are constructed and propagated in a bottom-up fashion. When the optimal solution is identified in the root node, a top-down back-trace is performed to get the optimal buffer assignment. Following this dynamic programming framework, various delay optimization buffer insertion algorithms have been developed in the existing literature, such as a proposal for wire segmenting with buffer insertion; for handling multi-source nets repeater insertion; considering noise and delay optimization simultaneously in buffer insertion; presenting an efficient algorithm for delay-optimal buffer insertion with O(n log n) time complexity by employing a sophisticated data structure. Buffer insertion with variations on wire length and fabrication were considered by other researchers. Power dissipation, however, was not considered in this research.

Buffer insertion can readily increase power dissipation if an excessive number of buffers are included. To leverage power efficiency and circuit performance, the team of J. Lillis, C. Cheng, and T. Lin, proposed a power-optimal buffer insertion algorithm toward achieving low power buffer insertion to given routed tree topologies based on utilizing timing slacks of tree branches. (Refer to article by J. Lillis, C. Cheng, and T. Lin, entitled: "Optimal Wire Sizing And Buffer Insertion For Low Power And A Generalized Delay Model", in ICCAD, November 1995.) The dynamic programming framework was adopted in this algorithm, wherein the number of options at each node grows in a pseudo-polynomial manner, as computation progresses from sinks to source. The runtime for large nets is unacceptably high due to the uncontrolled option increase. Another researcher assumed a large buffer library with near continuous buffer sizes toward solving the power-optimal buffer insertion problem with 5× speedup and negligible loss of delay and power optimality. However, single-$V_{dd}$ is assumed in all existing work for power optimal buffer insertion.

Recently, $V_{dd}$-programmable buffers have been used to reduce FPGA interconnect power. As buffers are pre-placed, and the dual-$V_{dd}$ buffer routing is simplified to dual-$V_{dd}$ assignment. However, the power optimal dual-$V_{dd}$ buffer insertion problem in ASIC designs is more complicated because the flexible buffer locations in interconnects introduce more design freedom, which increase the solution space substantially. This problem has not been addressed by the existing bodies of work.

Accordingly, a need exists for power saving VLSI circuit design and methods of dual-$V_{dd}$ buffer insertion which provide power savings with low overhead. The buffer insertion and tree construction techniques described herein fulfill these needs and others while overcoming drawbacks with existing techniques.

BRIEF SUMMARY OF THE INVENTION

One aspect of the present invention describes development of an effective algorithm to adopt the dual-$V_{dd}$ technique in buffer insertion for power reduction while satisfying the given delay constraint. A level converter free model is described which reduces the computational and power/delay overhead toward providing a solution for the dual-$V_{dd}$ buffer insertion problem. Compared to buffer insertion with single-$V_{dd}$ buffers, the use of dual-$V_{dd}$ buffers reduce power, such as by approximately 23% according to testing described herein, at the minimum delay specification. In addition, compared to the delay-optimal tree using single-$V_{dd}$ buffers, the power-optimal buffered tree described herein reduces power, such as by 7% and 18%, at the minimum delay specification when single-$V_{dd}$ and dual-$V_{dd}$ buffers are used respectively.

Compared to the single-$V_{dd}$ buffer insertion problem, the dual-$V_{dd}$ version introduces an extra dimension of the solution space, which makes the power optimal buffer insertion problem even more intractable with regard to conventional techniques. Therefore, effective pruning rules are taught herein for tackling the problem of dramatic complexity increment.

Another aspect of the invention proposes a sampling-based speedup technique and two prediction-based pruning rules for power-optimal dual-$V_{dd}$ buffer insertion, which are Pre-buffer Slack Pruning (PSP) which extends conventional techniques for dual-$V_{dd}$ buffer insertion, and Predictive Min-delay Pruning (PMP). Proofs are included to evidence a linear growth with respect to tree-size for the fast power optimal buffer insertion algorithm, with all speedup techniques, as described herein. Experimental results point towards sampling as the more effective speedup technique and the other two pruning rules further improve both efficiency and accuracy of sampling. A combined speedup of more than 1000× over the conventional exact power-optimal buffer insertion algorithm is shown at the expense of less than 2% delay and power increase.

The invention is amenable to implementation in a number of alternative ways, including but not limited to the following descriptions.

One embodiment of the invention can be generally described as an integrated circuit, which comprises: (a) an interconnect fanout tree carrying a logic or clock signal and including a source node, a plurality of sink nodes, a plurality of Steiner nodes, and a plurality of candidate buffer nodes; (b) a connection topology between nodes wherein a source node is interconnected by wires to the plurality of sink nodes through a plurality candidate buffer nodes at internal nodes of the circuit; and (c) at least one buffer, selected from buffers having multiple $V_{dd}$ levels (multi-$V_{dd}$ buffers), is inserted at selected candidate buffer nodes between the source and sink nodes within a given routing tree of the interconnect fanout tree; and wherein the multi-$V_{dd}$ buffers are inserted without the inclusion of level converters between buffers.

The multi-$V_{dd}$ buffers comprise either inverting or non-inverting buffers, and in one preferred implementation comprise dual-$V_{dd}$ buffers. The multi-$V_{dd}$ buffers are selected by a means for buffer insertion, or buffered tree generation, configured to select a buffer $V_{dd}$ level, within a set of candidate $V_{dd}$ buffer levels, to reduce power consumption as well as to reduce delay or delay difference, such as within the constraints of a required arrival time (RAT). It should be appreciated that by practicing this technique, level converters are not necessary between multi-$V_{dd}$ buffers.

Placement of the multi-$V_{dd}$ buffers is performed in the given routing tree so that buffers with lower $V_{dd}$ are not placed along a routing path of the routing tree before buffers with higher $V_{dd}$.

Multi-$V_{dd}$ buffers are inserted by a routing means configured to perform buffer insertion according to one or more techniques selected from the group of automatic design time reducing techniques consisting of pre-slack pruning (PSP), predictive min-delay pruning (PMP), 2D sampling, and 3D sampling. In one preferred configuration, buffer insertion is performed according to a combination of pre-slack pruning (PSP) and predictive min-delay pruning (PMP) followed by 3D sampling. In one mode, an escape grid reduction technique is utilized for multi-$V_{dd}$ buffer insertion.

Toward reducing routing memory requirements during pruning one aspect of the invention stores options in a data structure that is organized with a hash table indexed by capacitance.

One implementation of the invention can be described as a method of optimizing a logic or clock interconnection tree, comprising: (a) generating an interconnection tree having a source node interconnected by wires to a plurality of sink nodes through a plurality of Steiner nodes and a plurality of candidate buffer nodes; (b) selecting a multi-$V_{dd}$ buffer for insertion at a selected candidate buffer node within a given routing tree to reduce power consumption and delay or delay difference, such as meeting a required arrival time (RAT); and (c) inserting multi-$V_{dd}$ buffers at selected candidate buffer nodes between the source and sink nodes within the given routing tree of the interconnect tree.

The multi-$V_{dd}$ buffers are inserted in the given routing tree wherein buffers with lower $V_{dd}$ are not placed along a routing path of the routing tree before buffers with higher $V_{dd}$. In addition, the multi-$V_{dd}$ buffers are inserted without the inclusion of level converters between buffers.

Embodiments of the present invention can provide a number of beneficial aspects which can be implemented either separately or in any desired combination without departing from the present teachings.

An aspect of the invention is a method for dual-$V_{dd}$ buffer insertion within interconnect trees when designing integrated circuitry, such as VLSI.

Another aspect of the invention is to provide a buffer insertion method for use on either logic or clock signals.

Another aspect of the invention is to provide a buffer insertion method in which power consumption is reduced while satisfying the given delay constraints.

Another aspect of the invention is to provide a buffer insertion method which reduces the computational and power/delay overhead.

Another aspect of the invention is to provide a buffer insertion method which does not necessitate the inclusion of level converters.

Another aspect of the invention is to provide a buffer insertion method in which buffer insertion overhead is reduced utilizing a 2D or 3D sampling technique.

Another aspect of the invention is to provide a buffer insertion method in which buffer insertion overhead is reduced utilizing a pre-slack pruning (PSP) technique configured for multi-$V_{dd}$ buffer insertion.

Another aspect of the invention is to provide a buffer insertion method in which buffer insertion overhead is reduced utilizing a predictive min-delay pruning (PMP) technique configured for multi-$V_{dd}$ buffer insertion.

Another aspect of the invention is to provide a buffer insertion method which utilizes a combination of PSP, PMP and sampling techniques configured for multi-$V_{dd}$ buffer insertion.

Another aspect of the invention is to provide a buffer insertion method which performs a combination of PSP and PMP followed by 3D sampling configured for multi-$V_{dd}$ buffer insertion.

Another aspect of the invention is to provide a buffer insertion method in which memory overhead is reduced by utilizing a hash table indexed by capacitance.

Another aspect of the invention is to provide a buffer insertion method in which overhead is reduced using an escape grid reduction technique.

A still further aspect of the invention is to provide a buffer insertion method can be scaled.

Further aspects of the invention will be brought out in the following portions of the specification, wherein the detailed description is for the purpose of fully disclosing preferred embodiments of the invention without placing limitations thereon.

BRIEF DESCRIPTION OF THE SEVERAL VIEWS OF THE DRAWING(S)

The invention will be more fully understood by reference to the following drawings which are for illustrative purposes only:

DETAILED DESCRIPTION OF THE INVENTION

Figure 1A:
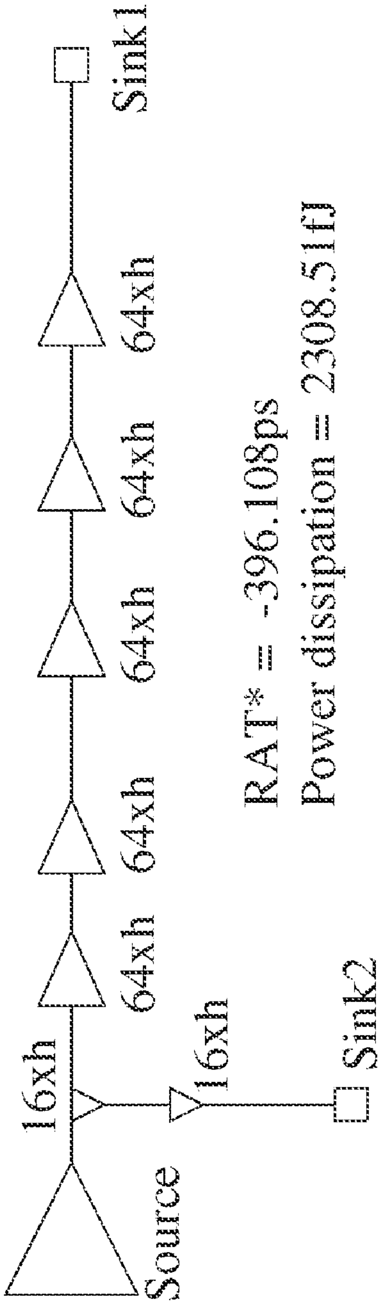
FIG. 1A-1B are block diagrams illustrating the effectiveness of dual-$V_{dd}$ buffer insertion for power reduction according to an aspect of the present invention.

Referring more specifically to the drawings, for illustrative purposes the present invention is embodied in the apparatus generally shown in FIG. 1 through FIG. 14B. It will be appreciated that the apparatus may vary as to configuration and as to details of the parts, and that the method may vary as to the specific steps and sequence, without departing from the basic concepts as disclosed herein.

Dual-$V_{dd}$ Buffering: Delay, Slew Rate and Power Model.

The following utilizes the distributed Elmore delay model, wherein the delay due to a piece of wire of length l is given by $$d(l) = \left(\frac{1}{2}c_w \cdot l + c_{load}\right) \cdot r_w \cdot l \quad (1)$$

where $c_w$ and $r_w$ are the unit length capacitance and resistance of the interconnect and $c_{load}$ is the capacitive loading at the end of the wire. Elmore delay times ln 9 are also utilized as a slew rate metric. The delay of a buffer, herein composed of two-stage cascaded inverters, is given by $$d_{buf} = d_b + r_o \cdot c_{load} \quad (2)$$

where $d_b$, $r_o$ and $c_{load}$ are the intrinsic delay, output resistance and capacitive loading at the output of the buffer respectively. Value $r_o$ and $d_b$ is obtained for both high $V_{dd}$ and low $V_{dd}$ buffers, and it should be observed that both values are higher for low $V_{dd}$ buffers.

In the context of buffer insertion with upper bound on slew rate, it should be appreciated that slew rates at the buffer inputs and the sinks are always approaching the upper bound within a few tens ps. Therefore, buffer delay is modeled with negligible error by approximating input slew rate using the upper bound. The reasoning behind this is that the buffer insertion length for delay-optimal buffer insertion is substantially longer than that for the sake of satisfying the slew rate constraint. This assertion can be verified using the conventional formulae (Refer to article by K. Banerjee and A. Mehrotra, entitled: "A Power-Optimal Repeater Insertion Methodology for Global Interconnects in Nanometer Designs". TCAD, vol. 49, no. 11, pp. 2001, 2007, 2002.) Note that more accurate slew rate and delay models that support bottom up (e.g., sink-to-source) calculation can be used instead, without the need to change the algorithms described herein.

Interconnect power is measured based on energy per switch. The energy per-switch for an interconnect wire of length l is given by $$E_w = 0.5 \cdot c_w \cdot l \cdot V_{dd}^2 \quad (3)$$

The per-switch short-circuit and dynamic power consumed by a buffer is collapsed into a single value $E_b$, which is a function of both $V_{dd}$ and buffer size. It is observed that low $V_{dd}$ buffers have a much smaller energy $E_b^L$ than the same-sized high $V_{dd}$ buffer having energy $E_b^H$. In this current model, the leakage power consumption is not considered so as to avoid the necessity of assuming operating conditions such as frequency and switching activity, tuning which can significantly temper the experimental results. Considering leakage tends to boost the power saving from dual-$V_{dd}$ buffer insertion, however, especially in the deep sub-micron regime. To consider leakage, we can simply add the leakage component $$\frac{P_{leak}}{f \cdot S_{act}}$$

to Eq. (3), where $P_{leak}$, f and $S_{act}$ are leakage power consumed by buffers, frequency and switching activity respectively. Settings and values for these tests are outlined in Table 1.

Dual-$V_{dd}$ Buffering: Dual-$V_{dd}$ Circuits.

Dual-$V_{dd}$ buffering uses both high $V_{dd}$ and low $V_{dd}$ buffers in interconnect synthesis. Designs using low $V_{dd}$ buffers consume less buffer power $E_{buf}$ and interconnect power as given by Eq. (3). Applying this technique to non-critical paths, power savings are achieved without worsening the delay of the overall interconnect tree.

Figure 1B:
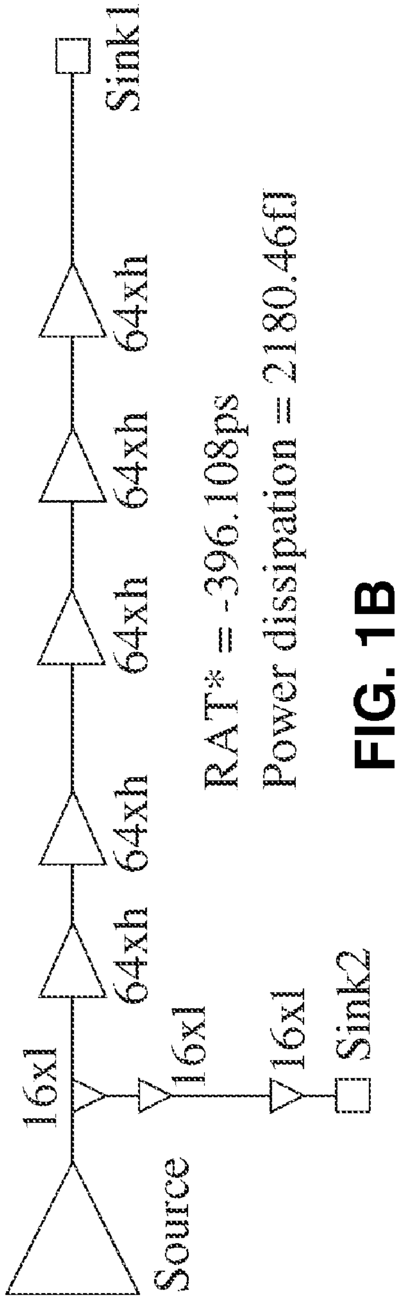

FIG. 1A-1B illustrate a simple instance to explain how dual-$V_{dd}$ buffer insertion reduces power dissipation. In this instance, the 65 nm technical parameters (see Table 1) are used. FIG. 1A shows an optimal buffer insertion solution with single-$V_{dd}$, and three types of high $V_{dd}$ buffers, 16×, 32× and 64×, are used in these calculations. FIG. 1B shows the optimal solution with dual-$V_{dd}$ buffers. In Sink1 and Sink2, the required arrival time (RAT) and load capacitance are set as 0 ps and 10 pf respectively. The simulation results show that both cases achieve optimal RAT at the source while the dual-$V_{dd}$ case reduces power dissipation by more than 5%. In another section it will be brought out that the dual-$V_{dd}$ technique saves additional power in larger scale nets. It is also found that the use of three low $V_{dd}$ buffers, instead of two high $V_{dd}$ buffers, are inserted in the non-critical path (Source to Sink2) while high $V_{dd}$ buffers are used for the critical path (Source to Sink1), which demonstrates the motivation herein for adopting dual-$V_{dd}$ in buffer insertion.

Dual-$V_{dd}$ Buffering: Level Converter Free Formulation.

When dual-$V_{dd}$ technology is employed, a $V_{dd}$-level converter should be inserted between the low $V_{dd}$ buffer and its high $V_{dd}$ fanout buffers to block the short circuit current. If a low $V_{dd}$ device drives a high $V_{dd}$ device and the low $V_{dd}$ device output is logic 1, both PMOS and NMOS transistors in the high $V_{dd}$ device will be at least partially "on", therein dissipating unacceptable amounts of leakage power due to short circuit current. To tackle this problem conventionally, some designers have made use of level converters to convert low $V_{dd}$ signal swing to a high $V_{dd}$ signal swing.

To avoid the computational and power/delay overhead of these $V_{dd}$-level converters, high $V_{dd}$ buffers can be followed by low $V_{dd}$ buffers but not the reverse. It is assumed that the driver at the source operates at high $V_{dd}$ and a V-level converter can only be placed at a high $V_{dd}$ sink if it is driven by a low $V_{dd}$ buffer. In fact, the power and delay overhead from a $V_{dd}$-level converter substantially prohibit use inside the interconnect tree. To illustrate, a simple case is considered.

Figure 2A:
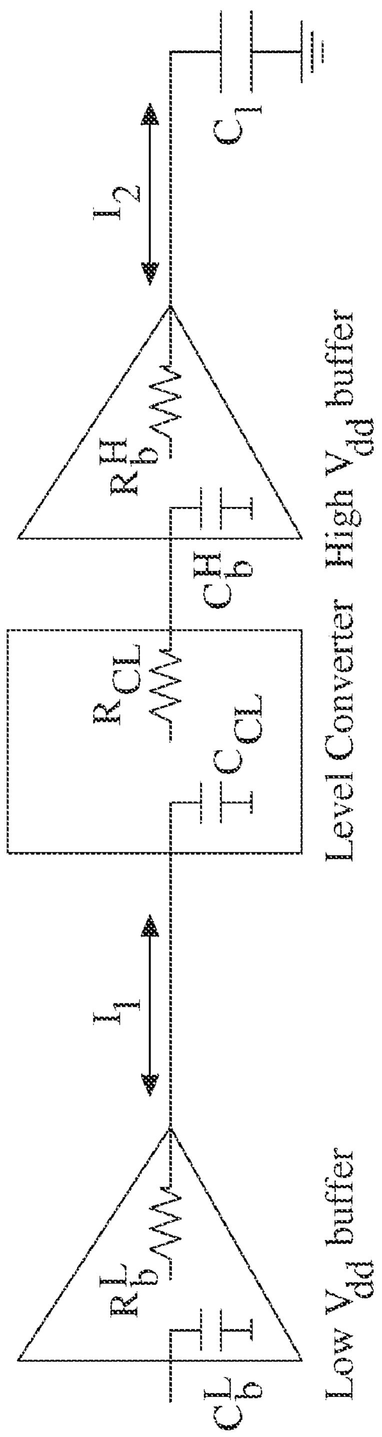
FIG. 2A-2B are block diagrams demonstrating level converter overhead according to an aspect of the present invention.
Figure 2B:
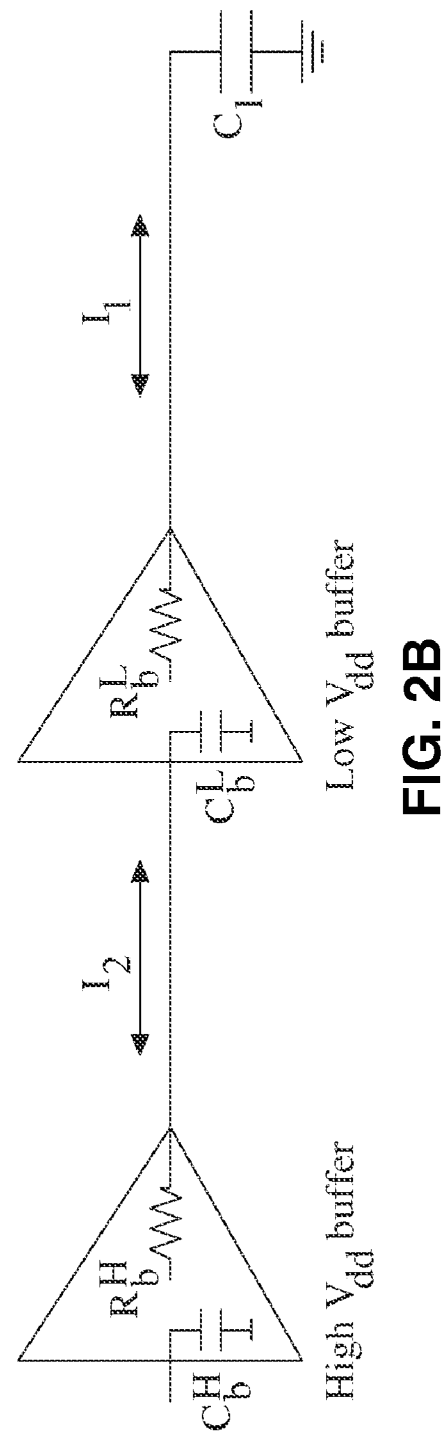

FIG. 2A-2B illustrate level converter overhead. The configuration in FIG. 2A consumes more power than that shown in FIG. 2B due to inclusion of the level converter and the fact that the low $V_{dd}$ buffer instead of the high $V_{dd}$ buffer is driving the load $C_l$. To have the delay of case FIG. 2B larger than that of FIG. 2A requires that:

$$(R_b^L - R_b^H)\cdot C_1 + R_b^H \cdot C_b^L - R_b^L \cdot C_{LC} - R_{LC}\cdot C_b^H - d_{LC} \geqq 0 \quad (4)$$

where $d_{LC}$ is the intrinsic delay of the level converter and all other parameters shown in FIG. 2A-2B. Many combinations of buffer sizes, including 16×, 32×, 64× were tried in this study along with properly-sized level converters. The parameters of these buffers and level converters are not included due to space limitations, but these parameters can be derived using the same methods noted in Table 1. It was found that $C_1$ has to be at least 0.5 pF, or equivalently a 9 mm long global interconnect worth of capacitance, for Eq. (4) to become true, which is extremely unlikely in any buffered interconnect design. Therefore, the block diagram shown in FIG. 2B, which has no level converter, is more likely the superior design over that shown in FIG. 2A. This logic justifies excluding level converters in these embodiments, thus reducing runtimes by considering a smaller and more productive solution space.

Figure 3B:
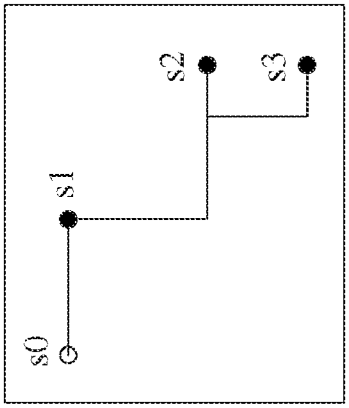
FIG. 3A-3B is a block diagram and topology, respectively, of a level converter before low $V_{dd}$ sinks according to an aspect of the present invention.
Figure 3A:
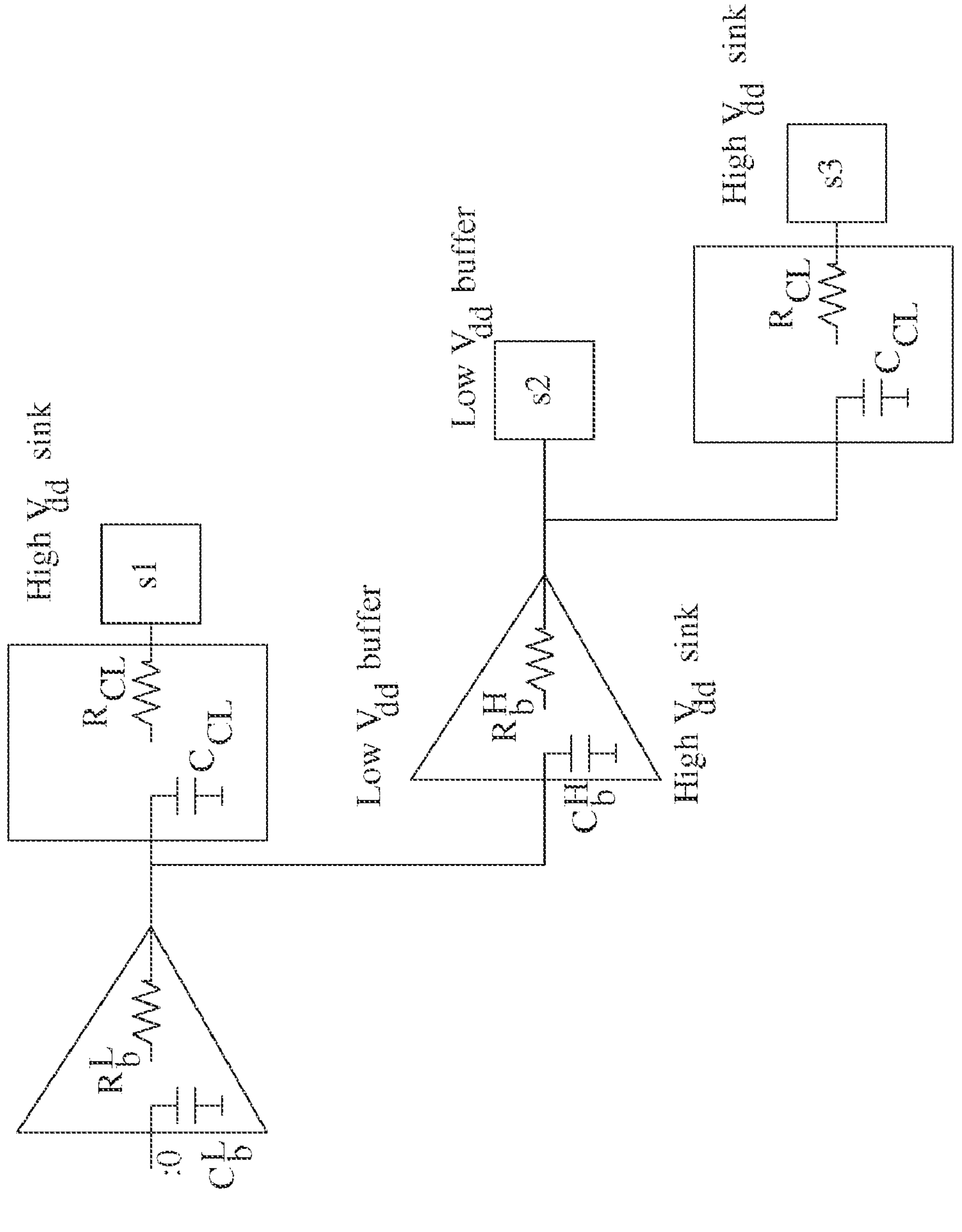

FIG. 3A-3B illustrate an example circuit and associated routing tree topology. Essentially, the level-converter-free model enables pushing all level converters in a net near to the sinks. If a low $V_{dd}$ buffer drives a high $V_{dd}$ sink as shown in FIG. 3A, with routing tree topology shown in FIG. 3B, then a level converter needs to be attached before the sink. For non-leave sinks, such as s1 in FIG. 3A, the actual route detours around the level converter.

Dual-$V_{dd}$ Buffering: Dual-$V_{dd}$ Buffer Insertion and Buffered Tree Construction Problem.

Herein it is assumed that the loading capacitance and required arrival times (RAT) $q_n^s$ are given at all sink terminals $n_s$. The driver resistance at the source node $n_{src}$ is assumed to be given, and all types of buffers can be placed only at the buffer candidate nodes $n_b^k$. The RAT is used at the source $n_{src}$ to measure delay performance. One of the goals herein is reduction or minimization of the power for the interconnect subject to the RAT constraint at the source $n_{src}$.

Definition 1: Required arrival time (RAT) $q_n$ at node n is defined as:

$$q_n = \min_n (q_n^s - d(n_s, n))$$

where $d(n_s,n)$ is the delay from the sink node $n_s$ to n.

Dual-$V_{dd}$ Buffer Insertion (dBIS).

Given an interconnect fanout tree which consists of a source node $n_{src}$, sink nodes $n_s$, Steiner nodes $n_p$, candidate buffer nodes $n_b$ and the connection topology among them, the dBIS Problem is to find a buffer placement, a buffer size assignment and a $V_{dd}$ level assignment solution such that the RAT $q_{src}^n$ at the source $n_{src}$ is met and the power consumed by the interconnect tree is minimized, while slew rate at every input of the buffers and the sinks $n_s$ are upper bounded by $\hat{s}$.

For the buffered tree construction problem, it is assumed that a floorplan of the layout is available, wherein can be identified the locations and shapes of rectangular blockages and the locations of the buffer station (BS) which are the allocated space for buffer insertion, with the following problem formulation.

Dual-$V_{dd}$ Buffered Tree Construction (D-Tree).

Given the locations of a source node $n_{src}$, sink nodes $n_s$, blockages and BS, the D-Tree problem is to find the minimum power embedded rectilinear spanning tree with a buffer placement, a buffer sizes and a $V_{dd}$ assignment that satisfy the RAT $q_n^{src}$ constraint at the source $n_{src}$ and the slew rate bound s at every input of the buffers and the sinks $n_s$.

Baseline Algorithm.

Power-optimal solutions are constructed from partial solutions from the subtrees and are called 'options' herein, which are defined below.

Definition 2: An option $\Phi_n$ at the node n refers to the buffer placement, size and $V_{dd}$ assignment for the subtree $T_n$ rooted at n. To perform delay and power optimization, the option is represented as a 4-tuple (cn;pn;qn;θn), where cn is the downstream capacitance at n, $p_n$ is the total power of $T_n$, $q_n$, is the RAT at n and $\theta_n$ signifies whether there exists any high $V_{dd}$ buffer at the down-stream. The option with the smallest power $P_{src\ n}$ at the source node $n_{src}$ is the power-optimal solution.

This algorithm is based on the algorithm of J. Lillis, C. Cheng, and T. Lin, referenced above, to which improvements have been added, such as the support for dual-$V_{dd}$ buffer insertion without level converters.

To facilitate explanation, the concept of option dominance is defined.

Definition 3: An option $\Phi_1$=(c1;p1;q1;θ1) dominates another option Φ=(c2;p2;q2;θ2) if c1≦c2, p1≦p2, and q1≦q2.

The conventional dynamic programming framework is enhanced to accommodate the introduction of dual-$V_{dd}$ buffers, as summarized in Table 2. The same notation is used as in Definition 2 to denote options Φ and their components. Moreover, we use $c_b^k$, $E_b^k$, $V_b^k$ and $d_b^k(c_{load})$ to denote the input capacitance, the power, the $V_{dd}$ level and the delay with output load $c_{load}$ of the buffer $b_k$. Variables $D_{n,v}$ and $E_{n,v}(V)$ are the delay and power, respectively, of the interconnect between nodes n and v operating at voltage V. The set of available buffers Set(B) contains both low $V_{dd}$ and high $V_{dd}$ buffers. We first call DP at the source node $n_{src}$, which recursively visits the children nodes and enumerates all possible options in a bottom up manner until the entire interconnect tree $T_{src}^n$ is traversed.

There are several new features in our algorithm in order to support the insertion of dual-$V_{dd}$ buffers. Our implementation considers the level converter timing and power overhead at the sinks, but we omit this part in Table 2 due to their relative insignificance to the delay and power of the whole tree. In fact, additional operations generated by level converters can be added initially (line 0) to support the overhead of dual-$V_{dd}$ sinks and level converters. Line 10 and 12 of Table 2 produce the new options $\phi_{new}$ for the cases of no buffer insertion and inserting buffer $b_k$ respectively between node n and v. In the case of no buffer insertion, we set $V_{dd}$ to either $V_H$ for high $V_{dd}$ or $V_L$ for low $V_{dd}$ at line 9 according to the down-stream high $V_{dd}$ buffer indicators $\theta_i,\theta_j$, and line 10 makes use of $V_{dd}$ to update the power consumed by the interconnect. Note that when θ=false (e.g., there is no high $V_{dd}$ buffers in the down-stream), only the low $V_{dd}$ option has to be created since the high $V_{dd}$ counterpart is always inferior. In the case of buffer insertion, $E_{n,v}(V_b^K)$ is added according to the operational voltage of buffer $b_k$ to $p_{new}$ and update θ accordingly. Also note that line 11 is used to guard against low $V_{dd}$ buffers driving high $V_{dd}$ buffers to avoid the need of level converters, as explained elsewhere.

As the starting point of the D-Tree algorithm, a grid is built using an "escape node algorithm" (Refer to article by R. Rao, D. Blaauw, D. Sylvester, C. Alpert, and S. Nassif, entitled: "An Efficient Surface-Based Low-Power Buffer Insertion Algorithm", in ISPD, April 2005.), and then an escape grid is generated by looking for intersection points between buffer stations and the grid lines. Escape grid, or Hanan grid, is formed by shooting horizontal and vertical lines from net terminals. The intersections of these grid lines form Steiner points, which does not allow buffer insertion in our formulation. Buffer insertion points are inserted whenever a grid line hits a buffer station, which are rectangular regions scattered across the floorplan. In the tree growing process in D-Tree, all non-redundant options in each node of the escape grid are recorded. To keep track of the sinks and the other nodes that the current options covered (to avoid cycles), each option needs to store a sink set S and a reachability set R. An option for D-Tree is denoted as Ψ=(S;R;rat;ap;pwr;θ), and the domination of two options is redefined as the following.

DEFINITION 3. In node n, option $\Psi_1$=(S1;R1;rat1;cap1; pwr1;θ1) dominates $\Psi_2$=(S2;R2;rat2;cap2;pwr2;θ2), if S1≦S2, rat1≦rat2, cap1≦cap2, and pwr1≦pwr2.

In each node of the escape grid, options are divided into subsets indexed by a covered sink set. Under each subset, a balanced search tree is maintained. Once a new option Ψ=(S; R;rat;cap;pwr;θ) is generated in an escape grid node, the most desirable option pruning strategy is to test the redundancy of $S_i$ in all subsets indexed by the sink set $S_i$≦S. However, up to 2n (where n is the number of sinks of the net) sink sets can be within a node, wherein it is inefficient to search for all related sink subsets for each option creation. According to the present embodiment, a check is performed to determine if any options in the full sink set (e.g., the sink set which includes all sinks) dominates Ψ, and if Ψ dominates any option under its own sink set S. In addition to the speedup techniques presented elsewhere, the following heuristic is applied to further narrow the search space.

Table 3 summarizes the D-Tree algorithm. Each option now stores the "sink set" S and "reachability set" R to keep track of the sinks and the other nodes that the current option covers. The algorithm starts by building a grid using the "escape node algorithm" (Refer to article by J. Xiong and L. He, entitled: "Fast Buffer Insertion Considering Process Variations", in Proc. Int. Symp. on Physical Design, 2006). Lines 1~4 create the candidate buffer insertion nodes $n_k^b$ by looking for intersection points between BS and the grid lines ($n_i$,$n_j$). The core process of creating new options $\Phi_{new}$ considering dual-$V_{dd}$ buffers is the same as that in the dBIS algorithm (refer to lines 8-18) with additional book-keeping to track the routability.

Experimental Results for Baseline Algorithm.

Nine test cases s1-s9 were generated by randomly placing source and sink pins in a 1 cm×1 cm box, using GeoSteiner package (Refer to article by D. Warme, P. Winter, and M. Zachariasen entitled "Geosteiner", in http://www.diku.dk/geosteiner, 2003) to generate the topologies of the test cases. Interconnections between nodes longer than 500 μm were broken by inserting degree-2 nodes. The $V_{dd}$ types of level converters under each of the sinks are set randomly. The characters of these test cases are shown in Table 4, which will be used in the next sections.

In all experiments of this paper, we assume that every non-terminal node is a candidate for a buffer node. The RAT is set at all sinks to 0 and the target RAT at the source to 101% ·RAT*, where RAT* is the maximum achievable RAT at the source, so that the objective becomes minimizing the power under 1% delay slack. The slew rate bound $\bar{s}$ is set to 100 ps. Buffers were made in this embodiment from an inverter cascaded with another inverter which is four times larger, although the technique is amenable to other configurations. There are six buffers (high $V_{dd}$ and low $V_{dd}$ buffers of 16×, 32×, and 64×) in the buffer library utilized for this example. By way of example, the experiments were performed on a Linux system with Intel PM 1.4 Ghz CPU and 1 Gb memory.

Due to the computational capability of the baseline algorithm (see Table 2), only small scale cases were tested. The experimental results for both single and dual-$V_{dd}$ buffer insertion are shown in Table 5. All sinks are set low $V_{dd}$ and no level converters are inserted, which make it clear to compare the effectiveness of power reduction by dual-$V_{dd}$ buffer insertion. In Table 5, RAT* is the maximum achievable RAT at the source. The percentages in the brackets show the relative change of power from BIS (single-$V_{dd}$ buffer insertion) to power by dBIS. We see that on average using dual-$V_{dd}$ buffers reduces power by 16.2% compared to the case when only high $V_{dd}$ buffers are used at RAT_. When the RAT is relaxed at the source to 105% of RAT*, the dual-$V_{dd}$ buffer solution saves 30% of power compared to the high $V_{dd}$ buffer-only solutions. In the next sections, it is described how the use of dual-$V_{dd}$ can reduce power dissipation more significantly for larger scale cases.

From Table 5, we can also find that the runtime of the baseline algorithm is unacceptable long. As the number of options in each node increases exponentially, without sophisticated controlling, it is computationally prohibitive to handle larger problems. To make the present methods more scalable, several speedup techniques are proposed which allow the dBIS to handle much larger scale test cases while maintaining solution quality.

For buffered tree construction, a set of six test cases were created by randomly generating source and sink pins in a 1 cm×1 cm box. Blockages were also randomly generated so as to consume approximately 30% of the total area of the box. Horizontal and vertical BS were randomly scattered in the box so that the average distance between two consecutive BS is about 1000 μm. All other settings are the same as dBIS. The experimental results of the baseline algorithm are shown in Table 8. From this table, it can be seen that compared to the delay-optimal tree using single-$V_{dd}$ buffers, the power-optimal buffered tree of the present invention reduces power by 7% and 18% at the minimum delay specification when single-$V_{dd}$ and dual-$V_{dd}$ buffers are used respectively.

Speedup Techniques.

To handle large nets efficiently, a few effective speedup techniques according to the present invention are presented for dBIS problem in this section.

Sampling.

Figure 4B:
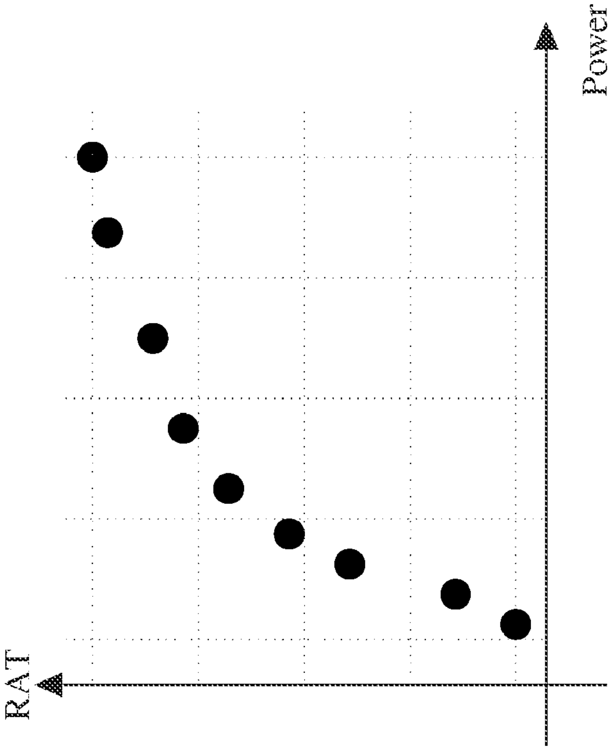
FIG. 4A-4B are graphs showing sampling of the non-dominated options according to an aspect of the present invention.
Figure 4A:
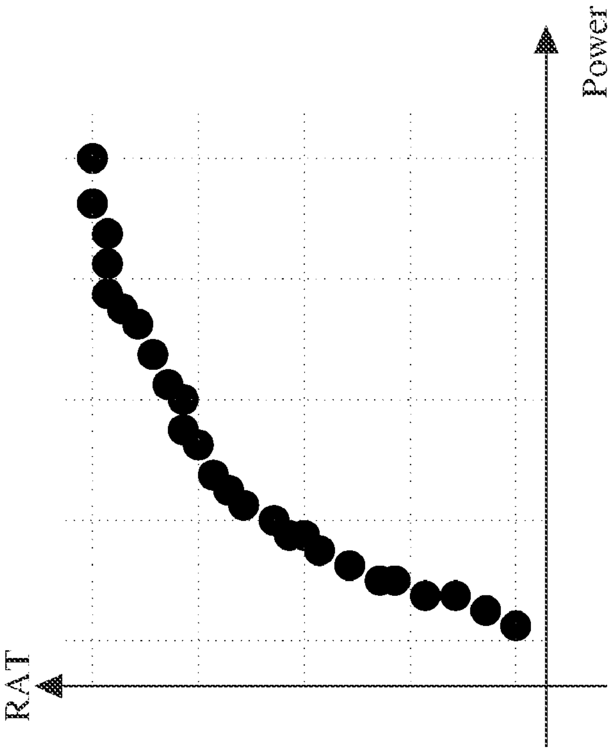

FIG. 4A-4B illustrates the use of sampling according to an aspect of the invention. The technique of sampling are applied to reduce the growth of options, which can go to the order of billions for large nets, if uncontrolled. The general idea is to pick only a certain number of options among all options for up-stream propagation (line 2 of Table 2) in the algorithm DP. FIG. 4A depicts the pre-sample and FIG. 4B depicts the after-sample option sets under the same capacitance. Each black dot corresponds to an option. Each side of the bounding box of all options is divided into equal segments such that the entire power-delay domains are superposed by a grid. For each grid square in FIG. 4A, only one option is retained if there is any. By also including the smallest power option and the largest RAT option, the sampled non-dominated option set in FIG. 4B is obtained.

To show the efficiency of the power-delay sampling, all test cases are checked s1-s9 with the same settings as described previously. The sampling grid is set as 20×20, which has been found to provide a suitable accuracy-runtime trade-off (explained in detail elsewhere).

Figure 5:
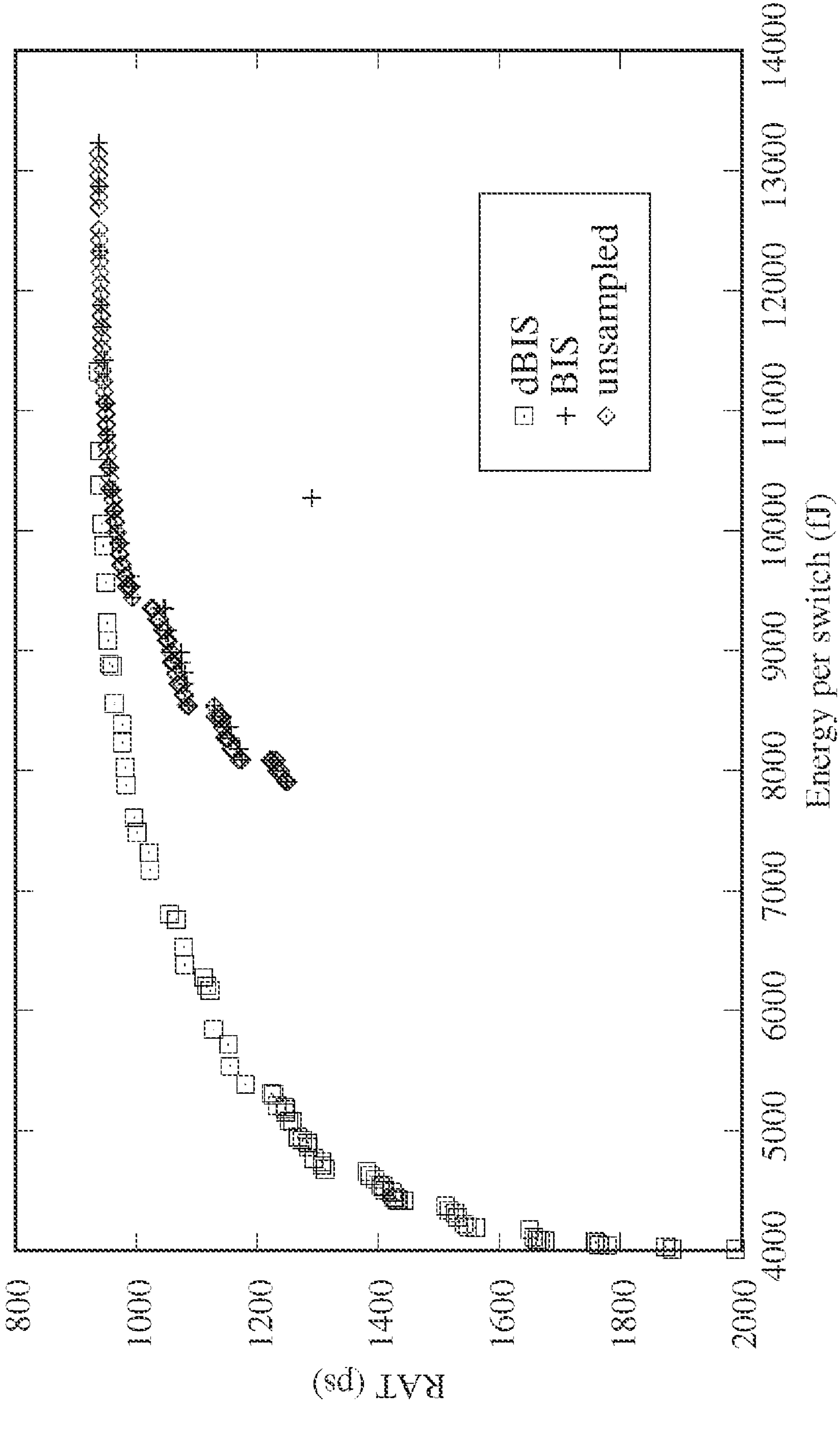
FIG. 5 is a graph showing non-dominated solutions of s4 according to an aspect of the present invention.

FIG. 5 shows all non-dominated options at the source node $n_{src}$ (e.g., valid solutions) of the test case s4. It is observed that the sampling approximation introduced by our dBIS algorithm has almost no impact on the power-delay optimality, as the options from BIS follow those from unsampled (optimal) results very closely. It is also seen that the introduction of dual-$V_{dd}$ buffers in dBIS significantly improves the power optimality by pushing all option to the left of the graph.

Power-delay sampling is integrated into the inventive algorithm, with the experimental results shown in Table 6. It is found from this that the runtime for small scale test cases (s1.s4) has been shortened by a factor of eight with the power-delay sampling and without losing optimality. At the same time, the dual-$V_{dd}$ buffer insertion reduces power dissipation by 29% and 33% when the delay constraints are RAT* and 105% RAT*, respectively. This observation again demonstrates the effectiveness of power dissipation reduction utilizing the present teachings of dual-$V_{dd}$ buffer insertion. It can also be seen that power reduction is substantially increased with regard to larger nets with dual-$V_{dd}$ buffers.

Under power-delay sampling a fixed number of options are picked under each capacitance, which has been shown to bring significant speedup. However, the runtime for larger scale test cases such as s8 and s9 is still substantial. In a further study of sampling techniques, we find the number of distinct capacitive values can not be neglected for large test cases when we perform sampling. Table 7 shows the statistics of the percentage of the nodes carrying a large number of distinct capacitive values for four nets. It is seen that over 50% of the nodes carry over 50 distinct capacitive values and over 10% of the nodes carry more than 100 capacitive values. When the scale of the test case becomes larger, it is expected that tree nodes carry more distinct capacitive values. Therefore, ongoing work can be performed to create more effective sampling rules by taking capacitance into consideration.

Power-delay sampling is now extended to 3D sampling, during which option samples are obtained based on all power, delay, and capacitance. The idea is to pick only a certain number of options, among all available options, uniformly over the power-delay capacitance space for upstream propagation.

Figure 6A:
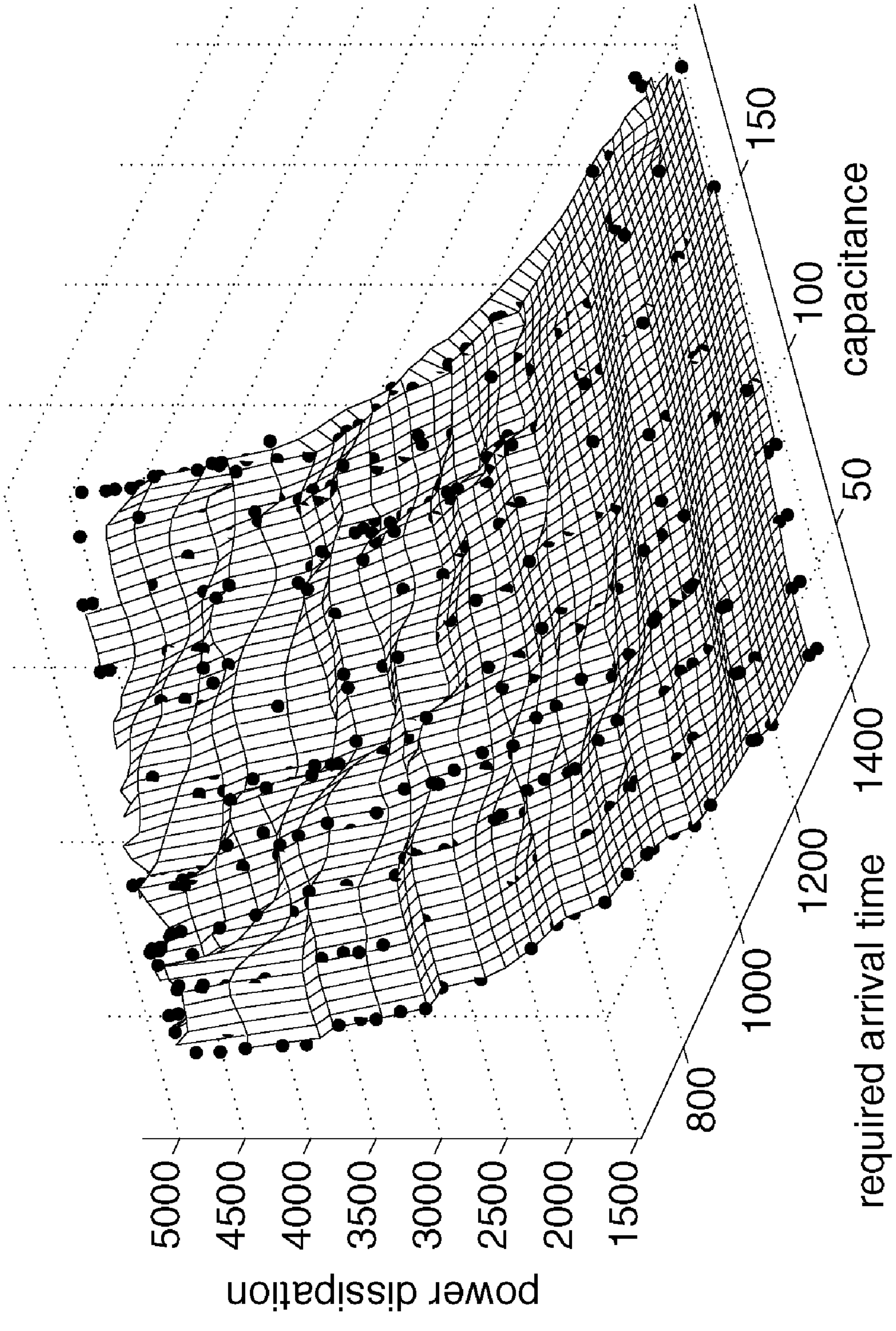
FIG. 6A-6B are 3D graphs showing sampling for non-redundant options according to an aspect of the present invention.
Figure 6B:
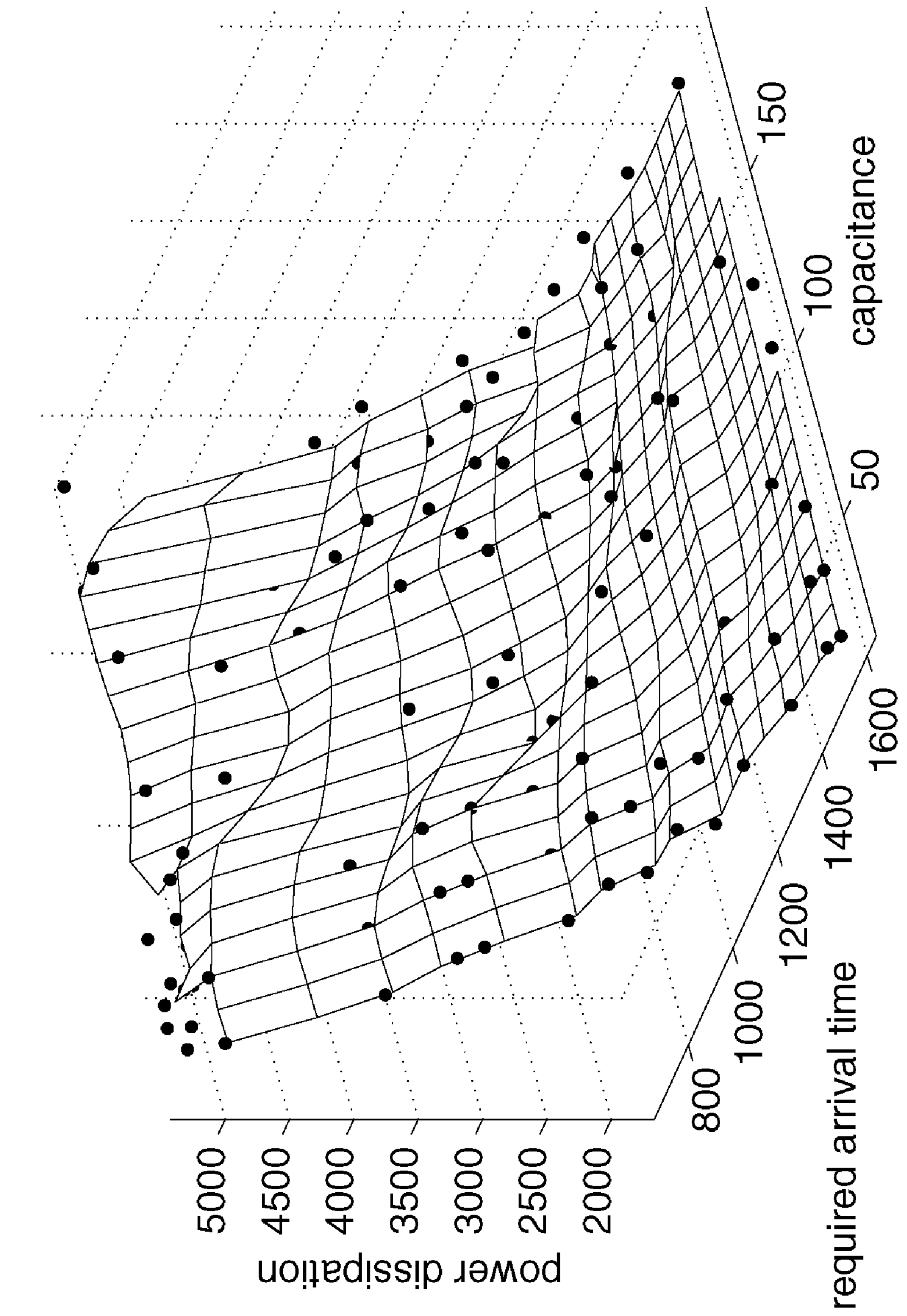

FIG. 6A illustrates a pre-sample option set and FIG. 6B illustrates an after-sample option set, with each dot corresponding to an option. Each side of the bounding box of all options is divided into equal segments such that the entire power-delay-capacitance domain is superposed by a cubic grid. For each grid-cube shown in FIG. 6A only one option is retained, if there is any, and the sampled non-dominated option set is obtained as shown in FIG. 6B.

To test the effectiveness of 3D sampling, testing is performed for s1.s9 on 20×20×20 sampling grids. Table 8 shows the comparison of results from both solution quality and runtime between power-delay sampling (columns 2d in the table) and 3D sampling (columns 3d in the table). Compared to the power-delay sampling, 3D sampling can achieve, on average, a ten-fold speed increase. Furthermore, the increase of options is controlled in each tree node under a linear manner by 3D sampling. For example, given the number of sampling grid on one side b, the upper bound of option number in a tree node is $b^3$, and the maximum number of options retained at all nodes is no more than $b^3 \cdot n$ for an n-node tree. As b is a constant, the growth of options is effectively linear for dBIS problem by using 3D sampling. If the buffer library size is treated as a constant, dBIS is expected to exhibit a linear complexity with 3D sampling. (Complexity is analyzed in another section.)

Detractors to the use of 3D sampling can also be seen from Table 8, including the introduction of a 5% delay increase and 2% power increase, which could make it prohibitive to simply employ 3D sampling in practical usage. It would therefore be preferably to calibrate 3D sampling. Along these lines it should be recognized that the accuracy of the solutions is affected by: (1) the density of the sampling grid; and (2) the quality of sampling candidates in the sampling pool.

Two additional prediction based pruning rules are presented as: (1) Pre-Slack Pruning (PSP) and (2) Predictive Min-delay Pruning (PMP), which can further prune redundancy so that 3D sampling can be performed in a better (more optimized) candidate pool, and more optimal options will be kept instead of being pruned in the sampling process. As an effect to 3D sampling, PSP and PMP indeed calibrate the sampling results and improve the solution quality as well as lead to further algorithm execution speed increases. Also, it will be shown that 20×20×20 sampling grids can achieve favorable runtime-accuracy trade-offs when PSP and PMP are utilized with 3D sampling.

Dual-$V_{dd}$ Buffer Pre-Slack Pruning (PSP).

Aggressive pre-buffer slack pruning (APSP) prunes redundancy by predicting upstream buffer delay. Therefore, the relative level of optimization of the current options is "pre-viewed" at a node, which allows dropping options that will be dominated after propagation. This prevents options from being populated at the upstream side and therefore helps reduce the time complexity.

Pre-Buffer Slack Pruning (PSP).

Suppose $R_{min}$ is the minimal resistance in the buffer library. For two non-redundant options $\phi_1=(q_1,c_1,p_1,\theta_1)$ and $\phi_2=(q_2,c_2,p_2,\theta_2)$, where $q_1<q_2$ and $c_1<c_2$, then $\phi_2$ is pruned, if $(q_2-q_1)(c_2-c_1)\geqq R_{min}$.

Value $R_{min}$ refers to the minimal resistance of the buffer library for single-$V_{dd}$ buffers, and has to be redefined for dual-$V_{dd}$ buffer insertion for optimal pruning. To handle dual-$V_{dd}$ buffers, a proper high/low $V_{dd}$ buffer resistance $R_H/R_L$ is chosen for PSP. When there exists some high $V_{dd}$ buffers in the downstream of the current option $\phi=(q,c,p,\theta)$, for example $\theta$=true, $R_H$ is used in PSP; otherwise $R_L$ is used. As $\theta$=true indicates no low $V_{dd}$ buffer is to be placed in upstream, it is overly aggressive to perform PSP by using $R_L(>R_H)$. On the other hand, it makes PSP more effective (to prune more aggressively) by using $R_L$ if there is no high $V_{dd}$ buffer downstream from $\phi$. To make the algorithm even faster, a resistance larger than $R_{min}$ is selected (e.g., Aggressive Pre-buffer Slack Pruning (APSP)). References regarding the Aggressive Pre-buffer Slack Pruning (APSP) process indicate that substantial (more than 50%) speedup can be obtained at a cost of approximately a 5% loss of optimality for min-cost (buffer number) buffer insertion problem. As the number of options in the dBIS problem is substantially larger than that of the min-cost problem, additional speedup can be expected from using a PSP approach.

Dual-$V_{dd}$ Buffer Predictive Min-delay Pruning (PMP).

The method also attempts to predict whether the option leads to a valid solution at the source by introducing the predictive min-delay pruning (PMP). This rule makes use of analytical formulae to calculate the lower bound of delay from any node to the source, which assumes a continuous number of buffers and buffer sizes. If such delay does not meet the delay specification at the source, the option is dropped to save the algorithm from unyielding option propagation. By way of example, consider an interconnect segment of unit length resistance r and unit length capacitance c. It is driven by a buffer of size s with unit driving resistance $r_s$, unit input capacitance $c_p$, and unit output capacitance $c_o$. The interconnect (with length l) is assumed to be terminated at the other end with another repeater of identical size. In a power optimal repeater insertion method (Refer to article by K. Banerjee and A. Mehrotra, entitled: "A Power-Optimal Repeater Insertion Methodology For Global Interconnects In Nanometer Designs", published in TCAD, vol. 49, no. 11, pp. 2001, 2007, 2002.) it is presented that the unit length delay is optimal when:

$$l_{opt} = \sqrt{\frac{2r_s(c_o + c_p)}{rc}},\ s_{opt} = \sqrt{\frac{r_s c}{r c_o}} \quad (5)$$

where $l_{opt}$ and $s_{opt}$ are the optimal buffer insertion length and the optimal buffer size, respectively. The optimum unit length delay $delay_{opt}$ is given by:

$$delay_{opt} = 2\sqrt{r_s c_o r c}\left(1 + \sqrt{\frac{1}{2}\left(1 + \frac{c_p}{c_o}\right)}\right) \quad (6)$$

A unit length minimum delay table indexed by buffer is computed with unit length resistance and capacitance, and the path length from the source to each tree node. It is assumed that high $V_{dd}$ buffers are used to calculate the unit length minimal delay, such that a lower bound is obtained when both high $V_{dd}$ and low $V_{dd}$ buffers are used.

Predictive Min-delay Pruning (PMP).

Given a required arrival time $RAT_0$ at the source, for a tree node v, its upstream delay lower bound is given by $dlb(v)=delay_{opt}\cdot dis(v)$, where dis(v) is the distance of the path from the source to node v. A newly generated option $\phi=(q,c,p,\theta)$ is pruned if $q-dlb(v)<RAT_0$.

It is interesting to note that some interesting observations were arrived at about PMP through extensive experimentation. For example, it was found that PMP prunes more options when $RAT_0$ is larger (e.g., the delay constraint is tight). Therefore, PMP essentially prevents unnecessary solution exploration when there is insufficient room for power optimization. Enhancing PMP has also been explored for use herein by considering the theoretical minimum power buffered interconnect from analytical methods, such as those put forth by K. Banerjee and A. Mehrotra in a paper referenced earlier. A pruning rule is now defined.

Predictive Min-power Pruning (p-PMP).

Given two options $\alpha_1=(p_1,q_1,c_1)$ and $\alpha_2=(p_2,q_2,c_2)$, $\alpha_1$ can be pruned if $p_1$+pre_$p_1>p_2$ and $q_1$+pre_$d_1<q_2$, where pre_$p_1$ and pre_$d_1$ are the min-power and min-delay between the source and the current node.

However, our experimental experience shows that the small extra gain in pruning power from p-PMP may not in some cases be sufficient to justify the overhead of the table lookup and the additional calculations needed. To perform p-PMP, the unit length min-delay table is pre-calculated as in PMP. In addition, another table needs to be prepared to store the unit length min-power with respect to the timing slack available, therein resulting in a large table indexed by $V_{dd}$, buffer size and slack. A few experiments were performed using these p-PMP rules. For instance, a test with s4 was performed (a 99-sink net with 137 nodes) by PMP and p-PMP, respectively. It was found that p-PMP only prunes 3% more options while the runtime with p-PMP rule takes about twice as long. It was observed that the analytical min-power buffered interconnect tends to provide a very loose lower bound for power and is therefore not effective for the purpose of pruning.

Studies on Speedup Techniques.

In this subsection, the relationship among all the aforementioned speedup techniques is explored, toward arriving at a combination optimized for practical use.

(1) Study on each individual speedup technique. To evaluate the speedup capability and create practical solutions of our speedup techniques (PSP, PMP and 3D sampling), dBIS is run by using each of them individually. The 3D sampling grid is set to 20×20×20, which has been found to yield a favorable accuracy-runtime trade-off. To compare the solution qualities, the power-optimal buffer insertion (PB) algorithm is run. In this test PB is modified to handle dual-$V_{dd}$ buffer insertion. Due to the limitation of the computational capability of PB, the large scale results are not given. Table 9 shows the comparisons of runtime and solution qualities. Note that PSP and PMP provide the same solution as PB, so this is listed as the results of PB/PSP/PMP together in Table 9. From Table 9, it is seen that PSP and PMP can achieve some speedup upon PB without a loss of optimization. It is also seen that sampling, both 2D and 3D, can achieve a ten-fold speed increase with only a 3% delay increase for small scale test cases. Note that, in some cases, such as s2 in Table 9, the power dissipation produced by '3D' is even smaller than the optimal one. Theoretically, power dissipation reduces while delay slack increases, hence smaller power dissipation can be produced by suboptimal approaches.

(2) Study on the effect of grid sizes for sampling. To make a further study on the effect of the grid size in 2D and 3D sampling. The sampling grid size was changed and experimental results were collected in the case of PSP and PMP employed with 3D sampling for five larger scale test cases. The results are shown in Table 10, where '-' means no solutions can be found under the given slew rate. From this table it can be seen that: (i) dBIS shows an effective linear runtime because of the bound of option number by 3D sampling; and (ii) satisfied solutions are provided with a substantial speedup when the grid size is set as 20×20×20.

Figure 7B:
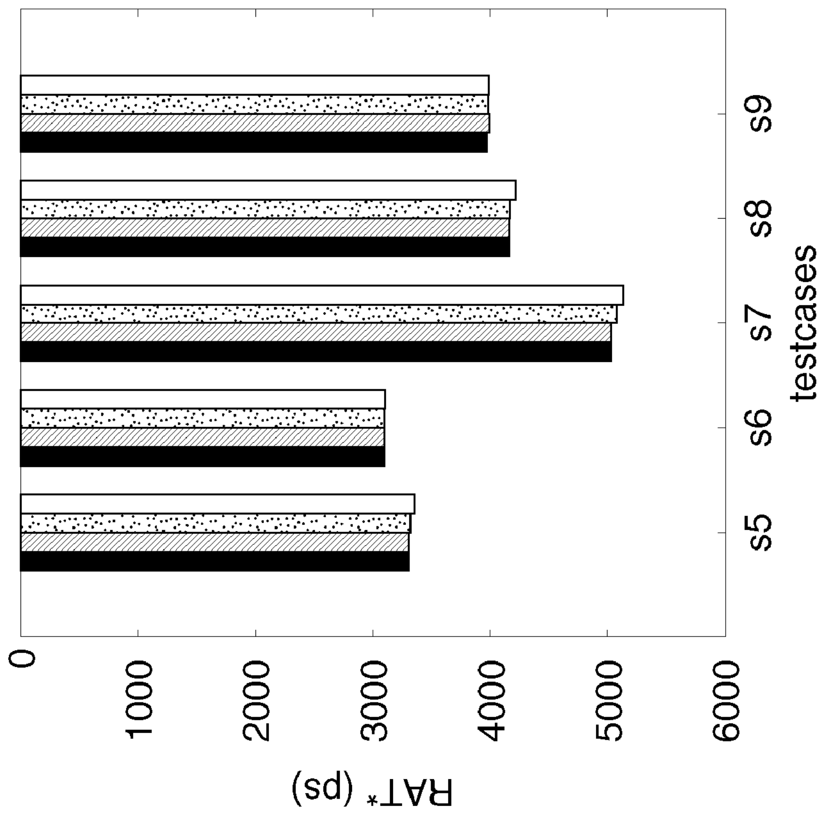
FIG. 7A-7B are graphs of test cases showing the effect of the grid size in sampling according to an aspect of the present invention.
Figure 7A:
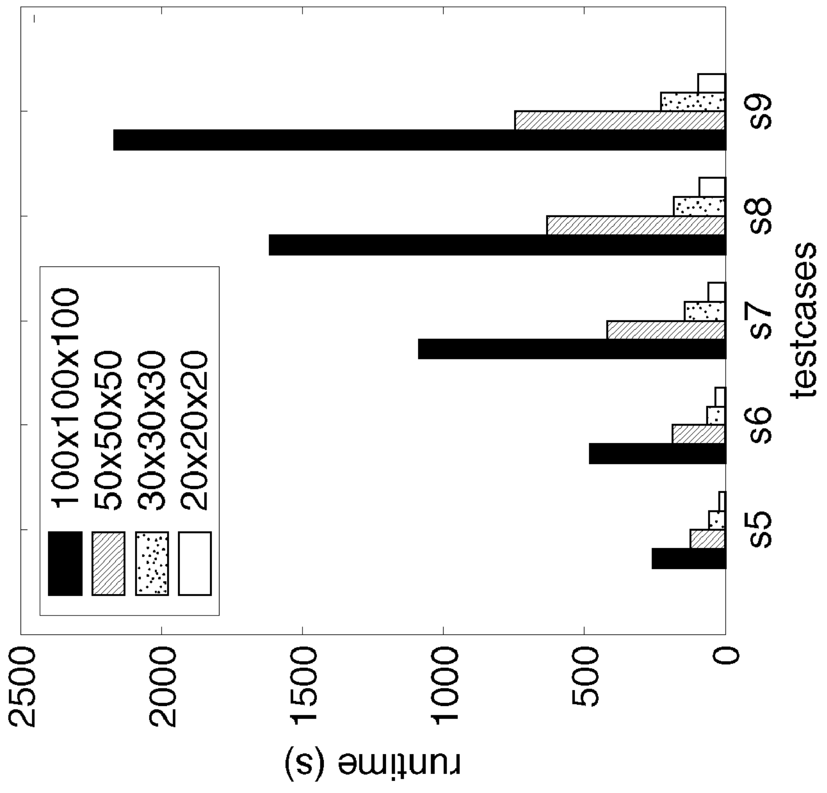

FIG. 7A and FIG. 7B provide a clearer view of the effect of the different grid sizes for sampling on runtime (FIG. 7A) and solution quality (FIG. 7B). It is found that runtime is reduced substantially when sparser sampling grids are utilized. However, it should be appreciated that there is only a minor loss of solution quality when the sampling grid becomes sparser. In practice, we have determined that setting the grid size as 20×20×20 provides a favorable trade-off between runtime and accuracy.

(3) Combine sampling and other pruning rules together. To figure out the effect of combining the sampling and pruning rules, dBIS is tested by combining 3D sampling, using 20×20×20 grids, with PSP and PMP respectively, with results shown in Table 11. For further comparisons, the results are also listed in Table 11 which are produced by employing only 3D sampling. From Table 11, the following observations can be made. (1) 3D sampling itself (column marked '3d') introduces significant errors for large test cases, although substantial speed increases are produced. (2) Both runtime and solution quality are improved by combining PSP and 3D sampling (column marked 'psp+3d'). A speed increase of over 2× on average is produced for 3D sampling. However, unacceptable errors still exist for large scale test cases (s7, s8 and s9). (3) When we combine PMP and 3D sampling together (column marked 'pmp+3d'), significantly improved solutions are obtained. The significant improvement is because PMP prunes many redundant options and keeps a bound of delay for existing options, so that 3D sampling can always select option samples from a favorable candidate pool, which improves solution quality while engendering some increase in speed. (4) By combining PSP, PMP and 3D sampling together (column marked 'psp+pmp+3d'), dBIS achieves the best performance on both solution quality and runtime compared to 3d, psp+3d and pmp+3d. For similar reasons as (3) above, PSP and PMP prune redundancy as much as possible, which always allows finding favorable sample candidates. Compared to PB in Table 9, psp+pmp+3d achieves over 1000× speedup for s4 with less than 2% delay and power increase. More speedup is expected due to the uncontrolled growth of options in PB. (5) Both psp+3d and pmp+3d can run much faster than 3D sampling for small test cases (s1 and s2), but the speedup ratio degrades for larger test cases. This degradation arises because of the lack of options that exist in each node of the buffered tree for small test cases, and 3D sampling will not work until the sampling bound is reached.

Data Structure for Pruning.

Based on the statistic of the options, this section describes finding a practical and efficient data structure within which to store options while pruning. Advanced data-structures for delay-optimal buffer insertion cannot be applied to power-optimal buffer insertion as they only accommodate up to two option labels, which are RAT and capacitance.

The data structure of J. Lillis, C. Cheng and T. Lin (reference discussed previously) describes an augmented orthogonal search tree for option pruning which is a suitable starting point for buffer insertion. They use a binary search tree labeled by power values as a container for search trees of capacitance and delay. In their algorithm they always add the options into the tree in the order of increasing capacitance. When combined with their dominance detection scheme, the algorithm adds only non-dominated options into the tree. However, this approach assumes that we know the order of option insertion, which is not true in some buffering problems, such as the buffered tree construction problem. In this problem, the order of node traversal is not known a priori due to the combinatorial nature of the path searching problem. Therefore, the order by which options are added to the search tree can no longer be guaranteed. As a consequence dominated options may reside in the search tree, which leads to $O((\log m)^2)$ time (where m is the number of options in the tree) per addition of an option to update if balanced trees are used. To make our buffer insertion algorithm applicable for other problems which adopt buffer insertion algorithms as a core, a more general data structure for pruning is sought. In this subsection, two data organization options are proposed from which a selection can be made based on the scale of the problem to be solved.

Figure 9:
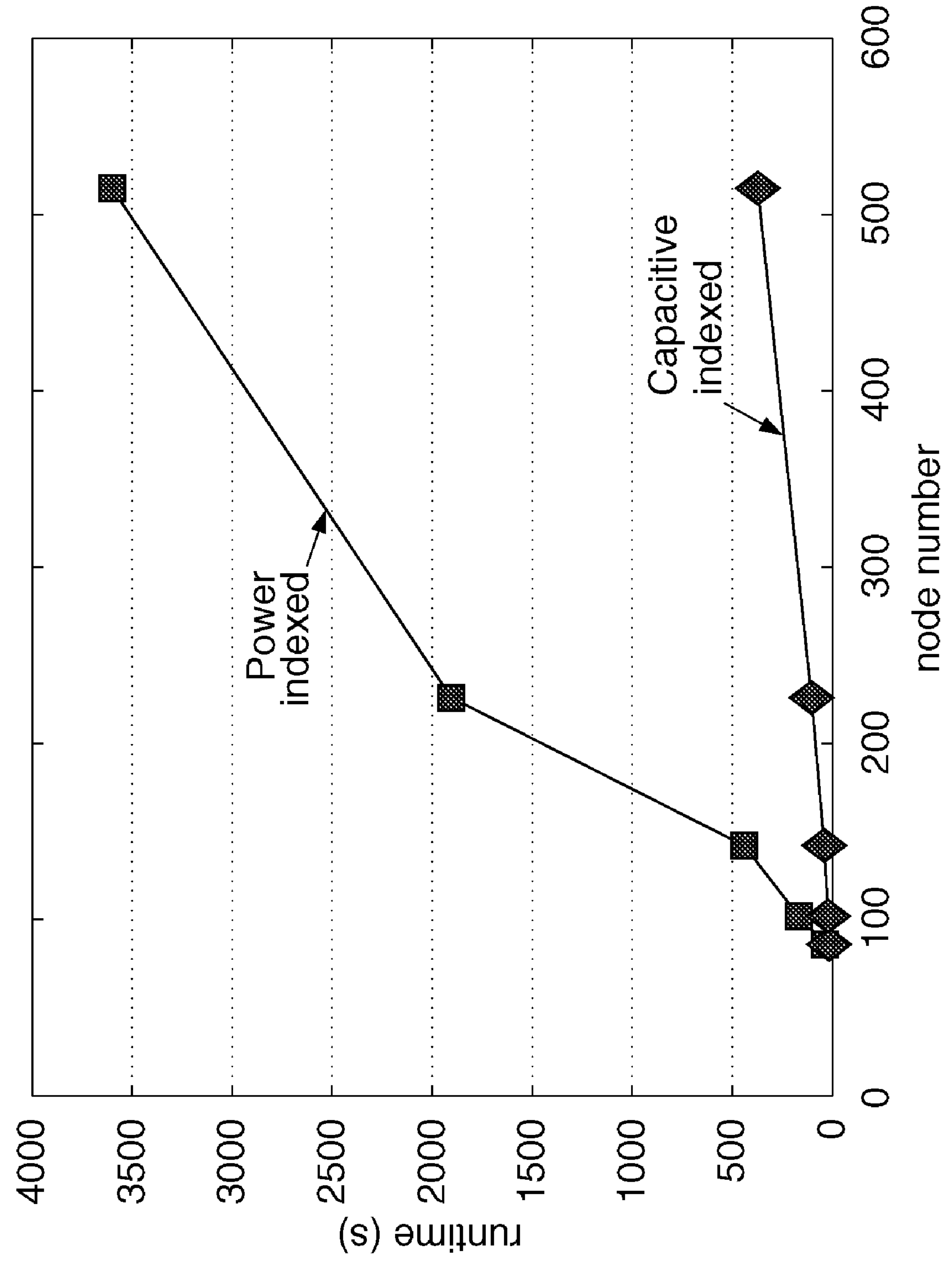
FIG. 9 is a graph of runtimes for power indexed and capacitive indexed organization according to an aspect of the present invention.
Figure 10:
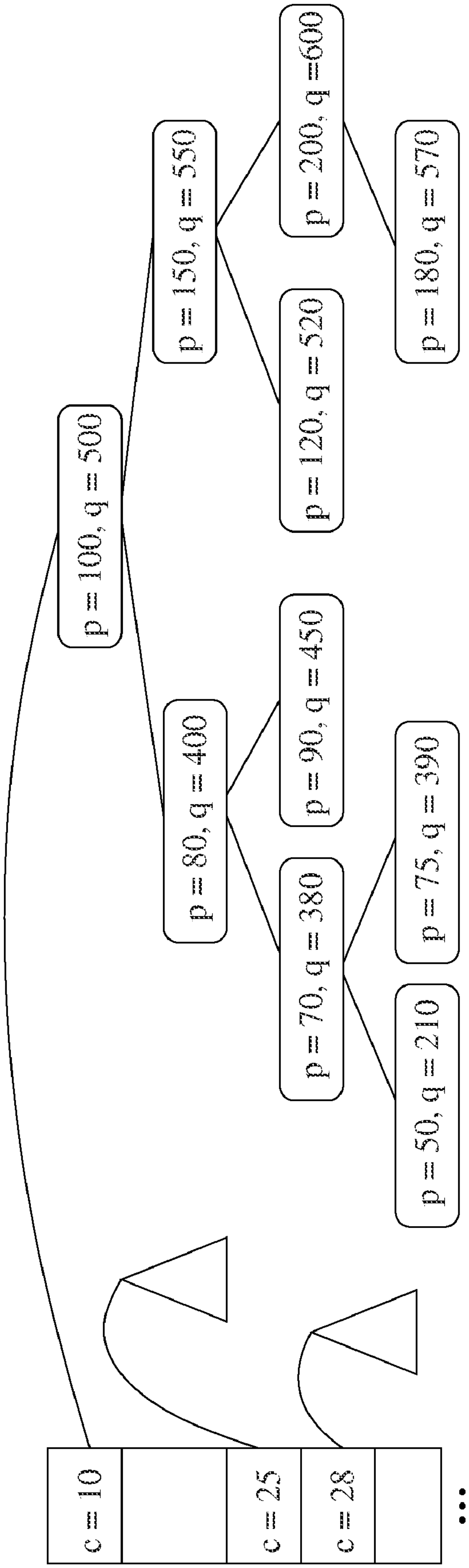
FIG. 10 is a data structure for option pruning according to an aspect of the present invention.

(1) Dynamic Pruning Tree. This mechanism provides a sophisticated way to organize options by labeling the hash table using capacitance instead of power and retaining the power and RAT portion of the options in the tree. This pruning data structure is named Dynamic Pruning Tree (see FIG. 10). The slew rate upper bound tends to tightly clamp the maximum value of capacitance and therefore the hash table tends to be smaller, which results in less search trees. FIG. 9 illustrates the runtime of five test cases calculated by dBIS with power indexed and capacitive indexed data structures, respectively. Only power-delay sampling is performed, and it can be seen that the power-indexed data structure is much slower than the capacitive indexed counterpart.

The search trees are ordered so that at each node the power value is larger (smaller) than those in the nodes of the left (right) subtree respectively. The tree is always maintained so that no option dominates any other. Following from this rule, it is immediately seen that all RAT q are in the same order as power p. For example, the q values in the left (right) subtree of the node n are smaller (larger) than the RAT q of n. Therefore, explicit maintenance of the largest RAT is not required in the left subtree as in the mechanism by J. Lillis, C. Cheng, and T. Lin referenced previously.

The algorithm to prune dominated options from the tree according to the present invention is summarized in Table 12. Set ($\Phi_n$), which contains the options at node n, are organized in the data structure mentioned above. In the pseudo-code any option $\Phi_{cur}$ is treated as a node in the search tree, and therefore $\Phi_{cur}$ left refers to the left child of the node storing the option $\Phi_{cur}$. The notation T_ is used to denote the subtree rooted at $\Phi$. For each capacitance value larger than that in the new option $\Phi_{new}$, lines 2-7 look for the first option $\Phi_{cur}$ in the tree that $\Phi_{new}$ dominates. If an option is found, lines 8-13 prune the left subtree of $\Phi_{new}$ with a single downward pass of the tree, which takes only O(log m) time for m options in the tree, by making use of the special tree ordering. The right subtree of $\Phi_{cur}$ is also pruned in a similar fashion. Note that after this step, options in the Set ($\Phi_{junk}$) can be removed and $\Phi_{new}$ can be inserted as usual in a balanced tree in O(log m) time. Rotation, which helps balancing the tree, requires no label updating insofar as no option in the tree is allowed to dominate.

Figure 11:
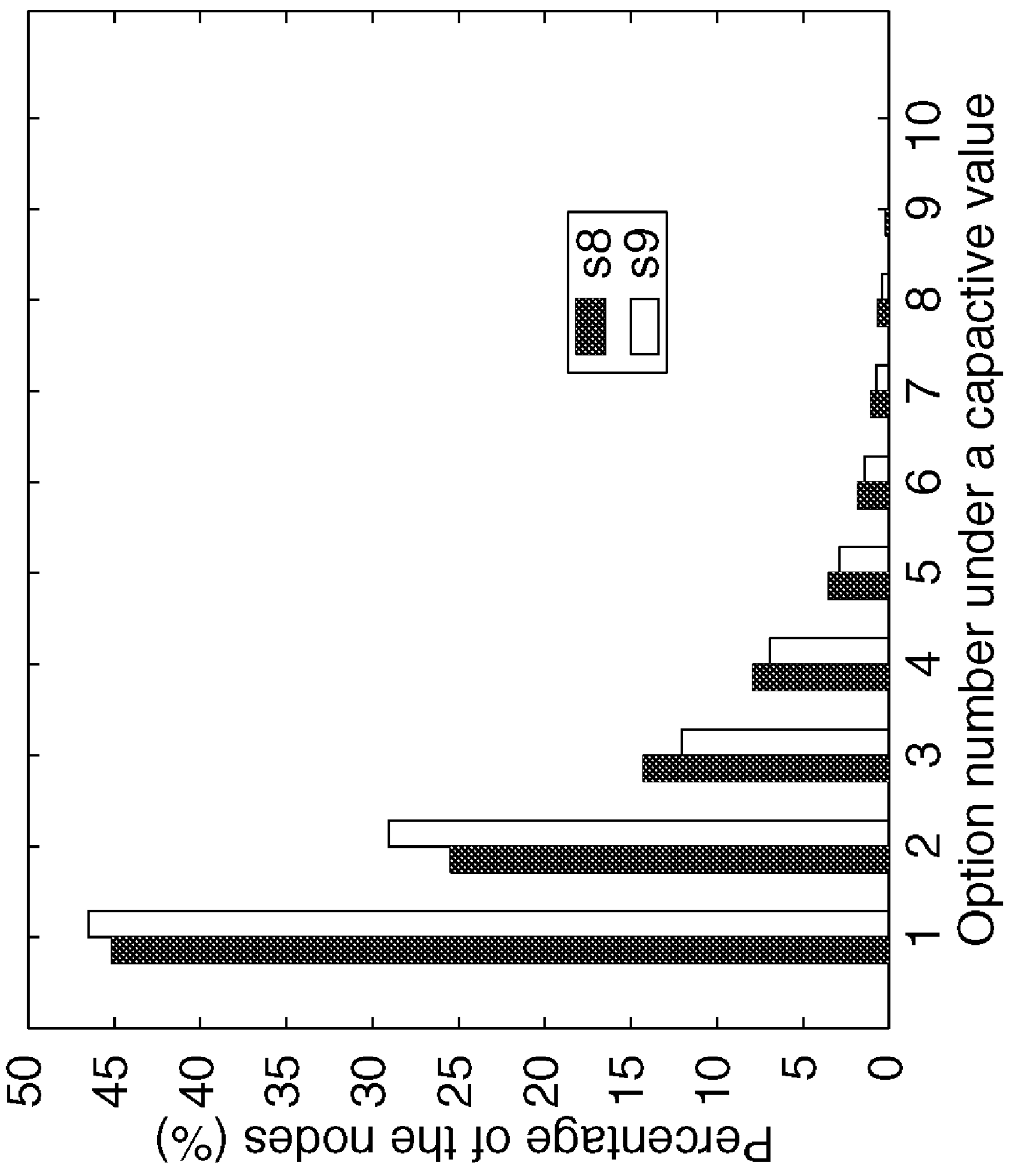
FIG. 11 is a graph showing average (power, RAT) as a pair number distribution according to an aspect of the present invention.

(2) Linear Pruning Structure. The Dynamic pruning tree data structure is efficient for handling extremely large scale problems, especially when there exists a large number of (Power, RAT) pairs under each capacitive value. When all of the speedup techniques described herein are performed the option number under each tree node is expected to be substantially smaller, which may cause the reduction of the (Power, RAT) pairs under each capacitive value. FIG. 11 shows the distribution of the average (Power, RAT) pair number under the same capacitive values of each tree node in the two largest test cases, s8 and s9, with all the speedup techniques performed. It is found that in all tree nodes, the average (Power, RAT) pair number is not more than 10, and is even less than 5 in most nodes. Nearly 50% of the nodes have an average of only one (Power, RAT) pair under each capacitive value.

Figure 12:
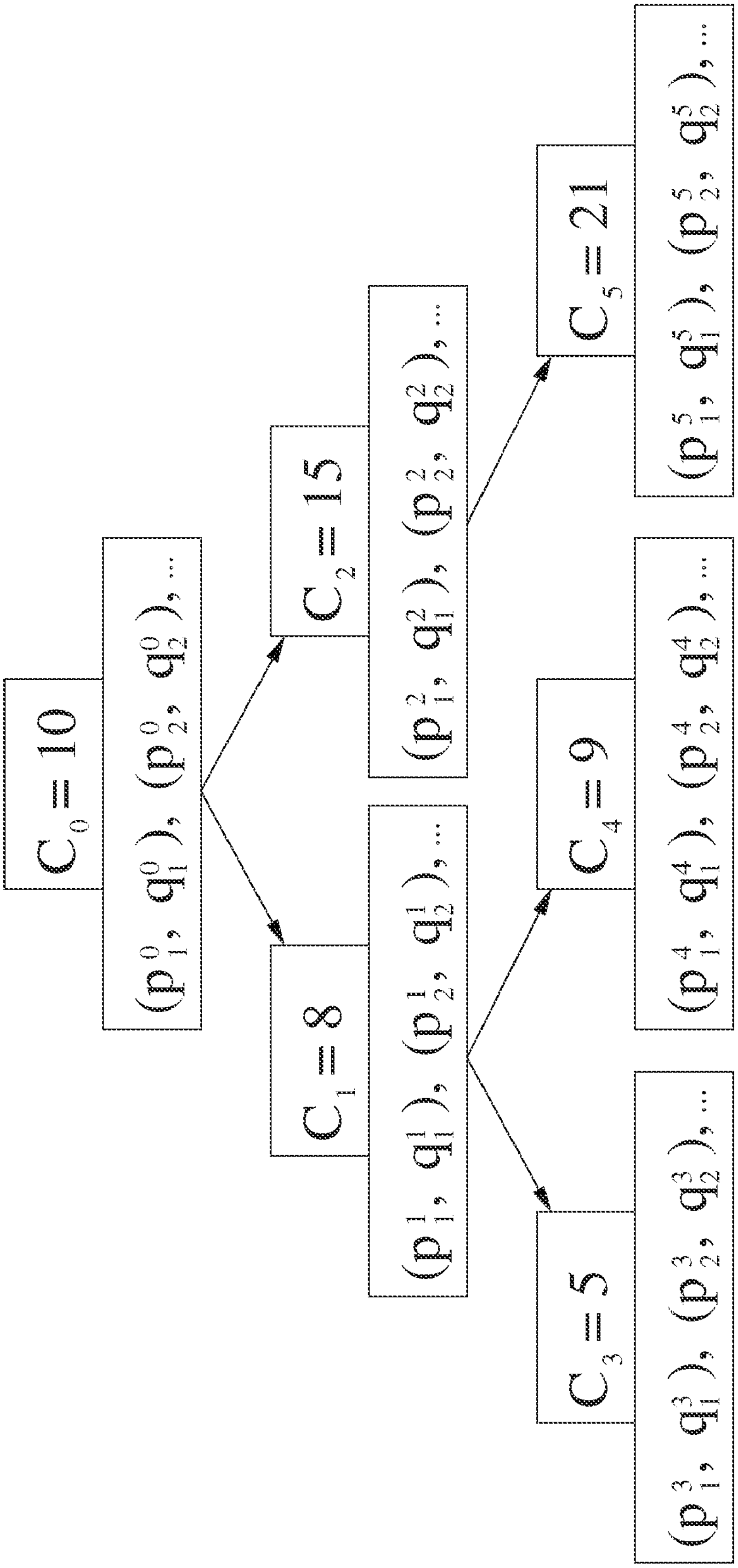
FIG. 12 is a data structure of the dBIS problem according to an aspect of the present invention.

These observations indicate that the sophisticated dynamic pruning tree structure loses its efficiency for (Power, RAT) pair organization. A very small portion of all $opList_c$ operations are sped up using only the sophisticated orthogonal search tree, yet significant runtime increases arise for other cases. In this situation, a balanced binary search tree BSTn is maintained that is sorted by downstream capacitance of the options, as shown in FIG. 12. Each node $opList_c$ in BSTn is a set of (ratn, pwrn) pairs. In one implementation the BSTn keeps the (rat, pwr) tuples in $opList_c$ as linked lists, which has the lowest runtime and memory overhead.

For the two kinds of data structures, the dynamic pruning tree structures are used for very large scale problems while linear pruning structures are used for common scale ones. In our experiments, we always used dynamic pruning tree structures associated with power-delay sampling and linear structures with 3D sampling, because 3D sampling provides good control of the number of (Power, RAT) pairs under each capacitive value for all test cases. The dynamic pruning tree structure can be expected to show increased efficiency for 3D sampling when substantially larger scale problems are considered. Though the largest test cases used in the example embodiments cover the scale range of general signal nets in ASIC circuits, the dynamic pruning tree structure provides a guarantee to handle even larger situation, therein illustrating that the algorithm is highly scalable.

F. Analysis of Fast dBIS Algorithm (dBIS with PSP, PMP and 3D Sampling)

As was mentioned in the previous section, we determined that an important key to reducing runtime is to reduce propagated options in the algorithm. The use of 3D sampling provides a constant upper bound on the number of options in each tree node. Therefore, the growth of options in Fast dBIS is effectively linear. Although PSP and PMP pruning rules can not guarantee a controlled growth of options, they help reduce the number of solutions, moreover, they prune redundancy from the candidate pool so that 3D sampling can be performed with greater efficiency.

Figure 8A:
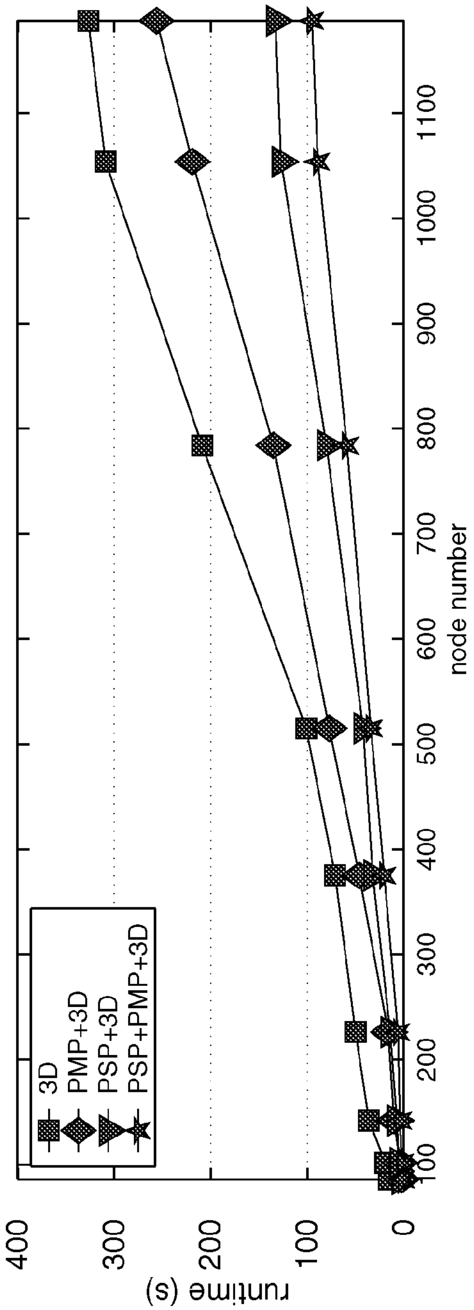
FIG. 8A-8B are graphs showing a comparison of runtime and solution quality with combination of sampling and other pruning rules according to an aspect of the present invention.
Figure 8B:
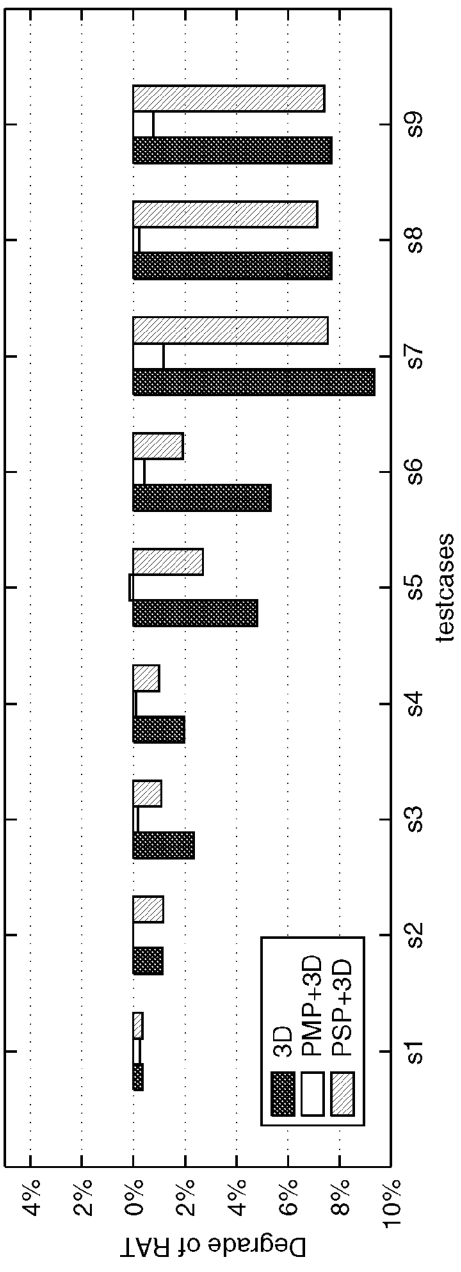

Since each node now has roughly the same number of options, it therefore takes approximately the same time to propagate all options from one node to the other, making runtime growth linear with respect to tree size. FIG. 8A illustrates runtime growth trend with respect to the number of nodes, and it is clearly seen that Fast dBIS has a roughly linear runtime complexity. The runtimes in our experimental results indicate that the constant behind the space complexity is not large. FIG. 8B illustrates degradation in RAT for the test cases s1-s9, showing solutions based on 3D, PMP+3D, and PSP+3D.

THEOREM 1: The space complexity of Fast dBIS is O(n), where n is the number of buffer stations.

Proof: By using 3D sampling, the number of options can be controlled in each tree node. For example, given the number of sampling grids on one side b, the upper bound on the number of options in a tree node is $b^3$, and the maximum number of options generated in the algorithm is no more than $b^3n$ for an n-node tree. As b is a constant, it means that the total number of options is reduced to O(n) for the dBIS problem. In our algorithm, all non-redundant options are stored to allow tracing back from the source node to find the optimal solution after bottom-up solution propagation. In the worst case, memory usage is proportional to the number of options. So the space complexity is O(n).

THEOREM 2: The time complexity of Fast dBIS is O(n), where n is the number of buffer stations.

Proof: Suppose the option sets in node $P_1$ and node $P_2$ are $Opt_1$ and $Opt_2$, respectively, where node $P_2$ is one of the children of node $P_1$. There are $n_1$ and $n_2$ options in set $Opt_1$ and set $Opt_2$, respectively. In bottom-up solution propagation, all options in node $P_2$ propagate by merging into options in node $P_1$, which requires $n_1n_2$ merges. In each merging, a new option $\Phi_{new}$ is generated based on option $\Phi_1$ from set $Opt_1$ and option $\Phi_2$ from set $Opt_2$ in constant time (i.e., calculate a 4-tuple (c,p,q,θ)). After which $\Phi_{new}$ is tested by PMP (predictive min-delay pruning) rule in constant time. If $\Phi_{new}$ is not pruned by PMP, it is tested by PSP (pre-slack pruning), in which (c,p,q-cR) of $\Phi_{new}$ are compared with those of other newly generated options. In the worst case, it takes m times comparing operations in PSP, where m is the number of newly generated options. The upper bound of the number of newly generated options by merging $Opt_1$ and $Opt_2$ is $n_1n_2$, which indicates that $n_1n_2$ time is needed in one merging operation according to a worst case. So it takes $n_1n_2 \cdot n_1n_2 = n_1^2n_2^2$ time to merge all options in node $P_1$ and node $P_2$ in a worst case situation.

For a non-root node P, the maximum number of children is three, as the rectilinear Steiner tree in a plane is considered. Suppose node $P_1$, node $P_2$ and node $P_3$ are three children of node P, respectively, and there are $n_1$, $n_2$ and $n_3$ options in node $P_1$, node $P_2$ and node $P_3$, respectively. Now the detailed process in bottom-up solution propagation is considered. At first, there is only one option in node P, which is (0; 0; ∞) as an initial setting for each unvisited node. Then all options in $P_1$ are merged into P in $n_1^2 \cdot 1^2 = n_1^2$ time, based on the analysis provided in the above paragraph, and in the worst case there are now $n_1$ options in P. After that, options in $P_2$ are merged into P in $(n_1^2n_2^2)$ time. Similarly, it takes totally $(n_1^2n_2^2n_3^2)$ time to generate all options in P with its children as per a worst case.

On the other hand, there exist only $b^3$, e.g., O(1), options in each node when using 3D sampling. Therefore, for any node n, we need at most $O(1)^2 \cdot O(1)^2 \cdot O(1)^2 = O(1)$ operations to merge all options in its children. In our bottom-up dynamic programming, merging operations are performed in each buffer node, wherein at most n(O(1))=O(n) time is needed in our BIS algorithm.

Escape Grid Reduction for Buffered Tree Construction.

Figure 13B:
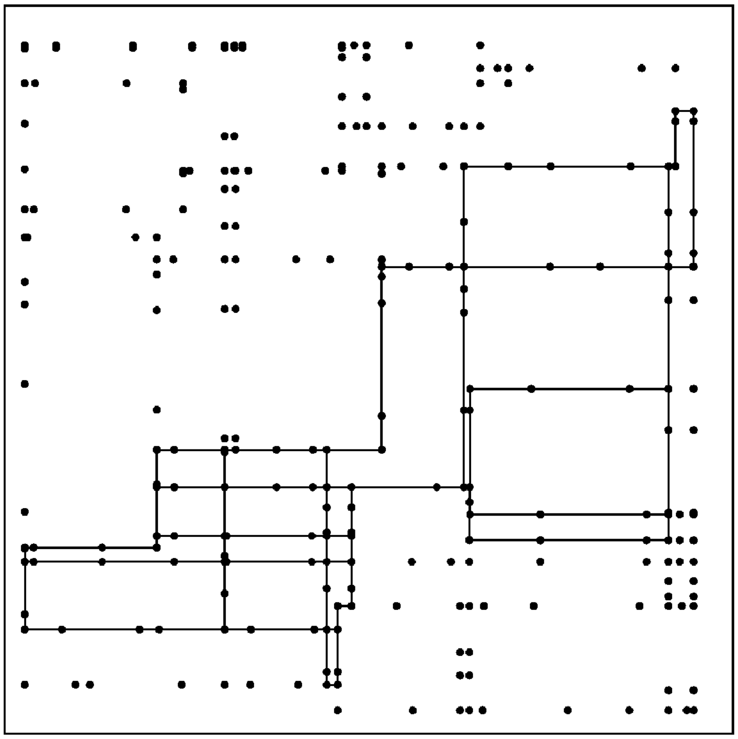
FIG. 13A-13B are grid diagrams showing escape grid reduction according to an aspect of the present invention.
Figure 13A:
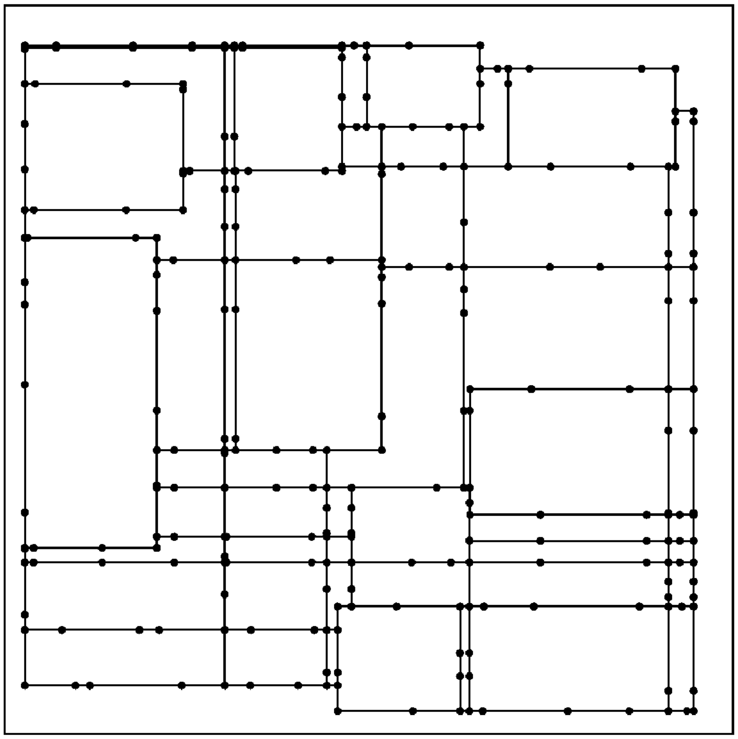

As the number of options grows exponentially with the number of grid nodes, the number of options can be reduced substantially by using grid reduction. Inspired by PMP, those grid nodes p are retained such that $dis(p,n_s^i)+dis(p,n_{src})=dis(n_s^in_{src})$ for any sink $n_s^i$, where $n_{src}$ is the source and dis(x,y) is the path length from node x to node y. This rule implies that all grid nodes are deleted which are not in any rectangles formed by sink-source pairs. This is reasonable in buffer tree construction since long-distance wire snaking causes harmful increases of delay and power dissipation. It should be noted that grid reduction may sometimes hamper the routability, as the within-bounding box grids get completely blocked by obstacles. To overcome this situation the sink-source bounding boxes are made larger in progressive steps until we get a connected reduced escape grid. The reduction rule is modified to retain those grid nodes p such that $dis(p,s_i)+dis(p,source)=(dis(s_i,source)+j*dieSize/10)$ for any sink $s_i$, where j=1, 2, . . . and so forth. FIG. 13B shows an example of a reduced grid derived from the full escape grid of FIG. 13A.

Table 13 shows a comparison between our Fast dTree algorithm and the S-Tree/D-Tree algorithms. The experimental results show that our Fast sTree/dTree (columns sTree/dTree') executes over one-hundred times faster than S-Tree/D-Tree with solutions requiring only 1% larger power consumption than that required by S-Tree/D-Tree techniques. Fast dTree can acquire a solution for a 10-sink net among a grid of 426 nodes in about one hour, while S-Tree/D-Tree fails to finish routing after one day. Moreover, this table illustrates the speedup obtained by our grid reduction heuristic. The column marked ‘n1#’ in the table shows the number of nodes left after grid reduction. The column marked ‘unreduced’ shows the runtime without grid reduction. It is found that the grid reduction achieves about a 2× speedup for the first 5 test cases. As for the last test case (426 nodes and 10 sinks), we were not even able to obtain a solution without grid reduction.

CONCLUSION

This paper presents the first in-depth study on applying dual-$V_{dd}$ buffers to buffer insertion and buffered tree construction for power minimization under delay constraint. Compared to buffer insertion with single-$V_{dd}$ buffers, dual-$V_{dd}$ buffers reduce power by 23% at the minimum delay specification. In addition, compared to the delay-optimal tree using single-$V_{dd}$ buffers, embodiments of our power-optimal buffered tree reduced power by 7% and 18% at the minimum delay specification when single-$V_{dd}$ and dual-$V_{dd}$ buffers are used respectively. To cope with the increased complexity due to simultaneous delay and power consideration and increased buffer choices, a sampling based speedup technique is described and two prediction based pruning rules are introduced for power-optimal dual-$V_{dd}$ buffer insertion. The conventional Pre-buffer Slack Pruning (PSP) technique is extended herein for performing dual-$V_{dd}$ buffer insertion, Predictive Min-delay Pruning (PMP) of which sampling is most effective, and the other two further improve both efficiency and accuracy of sampling. Furthermore, these techniques have proven scalability with linear runtime growth with respect to tree-size. A combined speedup of more than 1000× over the conventional power-optimal buffer insertion algorithm was achieved at the expense of a 2% delay and power penalty.

Figure 14A:
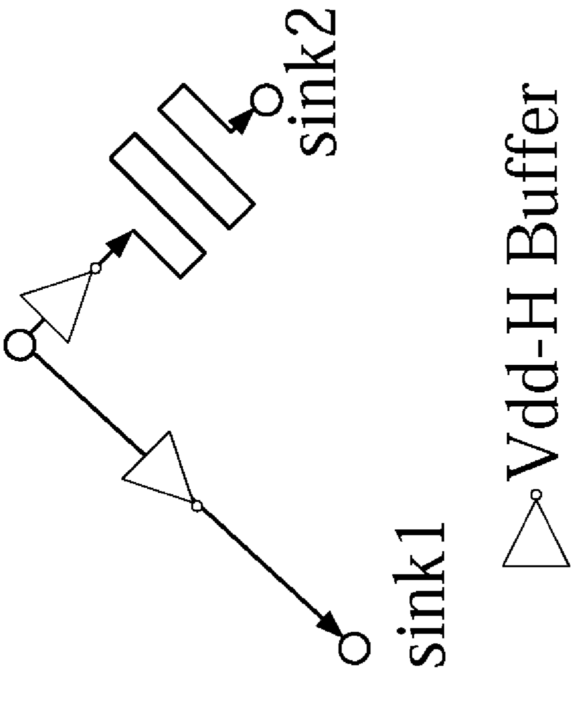
FIG. 14A-14B are block diagrams depicting the effectiveness of dual-$V_{dd}$ buffers in clock routing according to an aspect of the present invention.
Figure 14B:
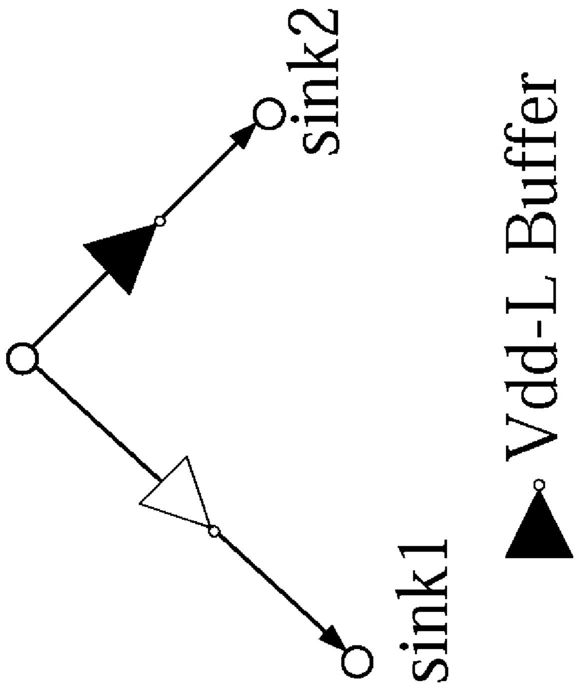

It should be appreciated that insertion of dual-$V_{dd}$ buffers within interconnects according to the present invention can be applied to both logic and clock signal routing. In FIG. 14A, a snaking path is used to balance the delay of both paths with single-$V_{dd}$ buffers. In FIG. 14B, a $V_{dd}$, buffer may be used to remove snaking and achieve balanced delay between sinks at reduced wire length and with less power.

Although the description above contains many details, these should not be construed as limiting the scope of the invention but as merely providing illustrations of some of the presently preferred embodiments of this invention. Therefore, it will be appreciated that the scope of the present invention fully encompasses other embodiments which may become obvious to those skilled in the art, and that the scope of the present invention is accordingly to be limited by nothing other than the appended claims, in which reference to an element in the singular is not intended to mean “one and only one” unless explicitly so stated, but rather “one or more.” All structural and functional equivalents to the elements of the above-described preferred embodiment that are known to those of ordinary skill in the art are expressly incorporated herein by reference and are intended to be encompassed by the present claims. Moreover, it is not necessary for a device or method to address each and every problem sought to be solved by the present invention, for it to be encompassed by the present claims. Furthermore, no element, component, or method step in the present disclosure is intended to be dedicated to the public regardless of whether the element, component, or method step is explicitly recited in the claims. No claim element herein is to be construed under the provisions of 35 U.S.C. 112, sixth paragraph, unless the element is expressly recited using the phrase “means for.”

TABLE 1

Settings for The 65 nm Global Interconnect

| Settings | Values |
|---|---|
| Simulators | Magma’s QuickCap (interconnect)<br>BSIM 4 + SPICE [20] (Device) |
| Interconnect | $r_w = 0.186\ \Omega/\mu m$, $c_w = 0.0519\ fF/\mu m$<br>(65 nm, global, min space and width) |
| Buffer<br>(min size) | $c_{in} = 0.47$ fF, $V_{dd}^H = 1.2$ V, $V_{dd}^L = 0.9$ V<br>$r_0^H = 4.7\ k\Omega$, $d_b^H = 72$ ps, $E_b^H = 84$ fJ<br>$r_0^L = 4.7\ k\Omega$, $d_b^L = 72$ ps, $E_b^L = 84$ fJ |
| Level converter<br>(min size) | $c_{in} = 0.47$ fF, $E_{LC} = 5.7$ fJ, $d_{LC} = 220$ ps |

TABLE 2

Dynamic Programming for Buffer Insertion

Algorithm: DP($T_n$, Set(B))
0. Set($\Phi_n$) = ($c_n^s$, 0, $q_n^s$, false) if n is a low $V_{dd}$ sink
    ($c_n^s$, 0, $q_n^s$, false), ($c_n^c$, 0, $q_n^c$, false) if n is a high $V_{dd}$ sink
    else (0, 0, ∞, false)
1. for each child v of n
2. Set($\Phi_v$) = DP($T_v$)
3. Set($\Phi_{temp}$) = Set($\Phi_n$)
4. Set($\Phi_n$) = ∅
5. for each $\Phi_i \in$ Set($\Phi_v$)
6. for each $\Phi_t \in$ Set($\Phi_{temp}$)
7. for each buffe r $b_k \in$ Set(B)
    /* also contains the no buffer option φ */
8. if $b_k = \phi$
9. $V_n = V_H$ if $\theta_i$ or $\theta_t$ is true, else $V_L$
10. $\Phi_{new}$ = ($c_i + c_t$, $p_i + p_t + E_{n,v}(V_n)$,
    min($q_t$, $q_i - d_{n,v}$), $\theta_i$ or $\theta_t$)
11. else if i. $V_b^k$ is high; or
    ii. $V_b^k$ is low and $\theta_i$ is false
12. $\Phi_{new}$ = ($c_b$, $p_i + p_t + E_{n,v}(V_b^k) + E_b^k$,
    min($q_t$, $q_i - d_{n,v} - d_b^k(c_i + c_{n,v})$,
    $\theta_t$ or (if $V_b^k = V_H$))
13. else goto line 7
14. if i. slew rate violation at down -stream buffers ; or
    ii. $\Phi_{new}$ domina ted by any $\Phi_z \in$ Set($\Phi_n$)
15. drop $\Phi_{new}$
16. else
17. remo ve all $\Phi_z \in$ Set($\Phi_n$) domin ated by $\Phi_{new}$
18. Set($\Phi_n$) = Set($\Phi_n$) ∪ {$\Phi_{new}$}
19. return Set($\Phi_n$)

TABLE 3

Dual-$V_{dd}$ Buffered Tree Construction

Algorithm DTREE($n_{src}$, Set($n_s$), Set(BS), Set(Blockage))
0. {Set($n_p$), N(Set(n))} = Grid(Set(n), Set(Blocakge))
1. for each node $n_i \in$ Set(n)
2. for each neighbour node $n_j \in N(n_i)$
3. Set(n) = Set(n)∪{$n_p$ created by edge ($n_i$, $n_j$)∩Set(BS)}
4. $N(n_p)$ = {$n_i$, $n_j$} ; update $N(n_i)$, $N(n_j)$
5. $Q(\Phi_n^{cur}) = \cup_{n_s \in Set(n_s)}$ Set($\Phi_n^s$)
6. while $Q(\Phi_n^{cur}) \neq \emptyset$
7. $\Phi_n^{cur}$ = pop $Q(\Phi_n^{cur})$
8. for each neighbour $n_j \in N(n_{cur})$
9. for each option $\Phi_n^j \in$ sampled Set($\Phi_n^j$)
10. if ($\Phi_n^j$.R) ∩ ($\Phi_n^{cur}$.R) = ∅
11. (form $\Phi_{new}$ similar to line 7~14 in Table 2)
12. $\Phi_{new}$.R = ($\Phi_n^j$.R) ∪ ($\Phi_{new}$.R)
13. $\Phi_{new}$.S = ($\Phi_n^j$.S) ∪ ($\Phi_{new}$.S)
14. if i. slew rate violation at downstream buffers; or
    ii. $\Phi_{new}$ dominated by any TABLE 3-continued

| Dual-$V_{dd}$ Buffered Tree Construction | |
|---|---|
| | $\{\Phi_n^j : (\Phi_{new}.S) \subseteq (\Phi_n^j.S), \Phi_n^j \in Set(\Phi_n^j)\}$ |
| 15. | drop $\Phi_{new}$ |
| 16. | else |
| 17. | remove $\{\Phi_n^j : (\Phi_{new}.S) \supseteq (\Phi_n^j.S), \Phi_n^j \in Set(\Phi_n^j)\}$ dominated by $\Phi_{new}$ |
| 18. | $Set(\Phi_n^j) = Set(\Phi_n^j) \cup \{\Phi_{new}\}$ |
| 19. | push $\Phi_{new}$ into $Q(\Phi_{cur})$ if $n_j \neq n_{src}$ |

TABLE 7

The Percentage of Nodes Carrying a Large Number of Distinct Capacitive Values

| node# | sink# | >100 | >50 |
|---|---|---|---|
| 515 | 299 | 14% | 62% |
| 784 | 499 | 17% | 64% |
| 1054 | 699 | 28% | 65% |
| 1188 | 799 | 33% | 71% |

TABLE 4

Characters for Test Cases

| net | Node# | Sink# | High-$V_{dd}$ sink# |
|---|---|---|---|
| s1 | 86 | 19 | 10 |
| s2 | 102 | 29 | 15 |
| s3 | 142 | 49 | 27 |
| s4 | 226 | 99 | 47 |
| s5 | 375 | 199 | 105 |
| s6 | 515 | 299 | 147 |
| s7 | 784 | 499 | 238 |
| s8 | 1054 | 699 | 340 |
| s9 | 1188 | 799 | 389 |

TABLE 8

Comparison Between Power-Delay Sampling and 3D Sampling

| | Runtime (s) | | RAT* (ps) | | Power RAT* (fJ) | |
|---|---|---|---|---|---|---|
| net | 2d | 3d | 2d | 3d | 2d | 3d |
| s1 | 36 | 15 | −1444.99 | −1465.03 | 13075.5 | 13798.7 |
| s2 | 62 | 19 | −1600.45 | −1619.07 | 14634.1 | 14379.8 |
| s3 | 96 | 36 | −2221 | −2268.45 | 20698.5 | 19478.4 |
| s4 | 264 | 67 | −1808.54 | −1841.09 | 28865.1 | 28828.4 |
| s5 | 640 | 71 | −3334.22 | −3513.18 | 32889.1 | 32510.9 |
| s6 | 987 | 101 | −3085.04 | −3271.83 | 39964.8 | 41617 |
| s7 | 2232 | 209 | −5188.36 | −5612.88 | 51569.6 | 50677.2 |
| s8 | 3427 | 329 | −4222.7 | −4539.6 | 55319.1 | 54986.8 |

TABLE 5

Experimental Results for Single and Dual-$V_{dd}$ Buffer Insertion

| | Runtime (s) | | RAT* (ps) | Power RAT* (fJ) | | Power 105% RAT* (fJ) | |
|---|---|---|---|---|---|---|---|
| Net | BIS | dBIS | BIS/dBIS | BIS | dBIS | BIS | dBIS |
| s1 | 176 | 258 | −1444.99 | 5967.6 | 13075.5 [18%] | 13794.2 | 10740.4 [22%] |
| s2 | 277 | 690 | −1600.45 | 7010.5 | 14634.1 [14%] | 15833 | 12179.8 [23%] |
| s3 | 412 | 609 | −2221 | 4654.2 | 20698.5 [16%] | 21038.2 | 17244.4 [18%] |
| s4 | 926 | 1650 | −1808.54 | 4537.3 | 28865.1 [16%] | 30562.1 | 16684.3 [45%] |
| ave | | | | 3042.4 | 19318.3 [16.2%] | 20306.9 | 14212.2 [30%] |

TABLE 6

Experimental Results for Single and Dual-$V_{dd}$ Buffer Insertion with Power-Delay Sampling

| | Runtime (s) | | RAT* (ps) | Power RAT* (fJ) | | Power 105% RAT* (fJ) | |
|---|---|---|---|---|---|---|---|
| net | BIS | dBIS | BIS/dBIS | BIS | dBIS | BIS | dBIS |
| s1 | 16 | 36 | −1444.99 | 15967.6 | 13075.5 [18%] | 13794.2 | 10740.4 [22%] |
| s2 | 28 | 62 | −1600.45 | 17010.5 | 14634.1 [14%] | 15833 | 12179.8 [23%] |
| s3 | 50 | 96 | −2221 | 24654.2 | 20698.5 [16%] | 21038.2 | 17244.4 [18%] |
| s4 | 126 | 264 | −1808.54 | 34537.3 | 28865.1 [16%] | 30562.1 | 16684.3 [45%] |
| s5 | 274 | 640 | −3334.22 | 45331.7 | 32889.1 [27%] | 42798.5 | 30443.7 [29%] |
| s6 | 380 | 987 | −3085.04 | 55833.7 | 39964.8 [28%] | 52758.2 | 35993.6 [32%] |
| s7 | 880 | 2232 | −5188.36 | 73136.6 | 51569.6 [29%] | 68456.8 | 48297.7 [29%] |
| s8 | 1590 | 3427 | −4222.7 | 84945.6 | 55319.1 [35%] | 80181.7 | 51452.3 [36%] |
| s9 | 2130 | 5625 | −3963.17 | 89624.7 | 57071.4 [36%] | 86567.6 | 54181.4 [37%] |
| ave | 608 | 1485 | | 49004.66 | 34898.58 [29%] | 45776.7 | 30801.96 [33%] |

TABLE 8-continued

| Comparison Between Power-Delay Sampling and 3D Sampling | | | | | | |
|---|---|---|---|---|---|---|
| | Runtime (s) | | RAT* (ps) | | Power RAT* (fJ) | |
| net | 2d | 3d | 2d | 3d | 2d | 3d |
| s9 | 5625 | 327 | −3963.17 | −4293.49 | 57071.4 | 59291.9 |
| ave | 1485 | 130 [1/10] | −2985.38 | −3158.29 [105%] | 34898.58 | 35063.23 [102%] |

TABLE 12

Dynamic Tree Update

Algorithm CleanDominate($\Phi_{new}$, Set($\Phi_n$))
0. Set($\Phi_{junk}$) = ∅
1. for each distinct capacit ance c > $c_{new}$ in Set($\Phi_n$)
2. $\Phi_{cur}$ = option at the root of the search tree under c
3. while $\Phi_{cur} \neq \phi$
4. case 1: $p_{new} < p_{cur}$, $q_{new} < p_{cur}$, $\Phi_{cur} = \Phi_{cur} \rightarrow$ left
5. case 2: $p_{new} < p_{cur}$, $q_{new} > q_{cur}$, goto line 2

TABLE 9

| Comparisons of Individual Speedup Techniques | | | | | | | | | | | |
|---|---|---|---|---|---|---|---|---|---|---|---|
| | Runtime (s) | | | | | RAT* (ps) | | | Power RAT* (fJ) | | |
| net | PB [9] | pmp | psp | 2d | 3d | PB/pmp/psp | 2d | 3d | PB/pmp/psp | 2d | 3d |
| s1 | 176 | 184 | 146 | 36 | 15 | −1444.99 | −1444.99 | −1465.03 | 13075.5 | 13077.6 | 3798.7 |
| s2 | 329 | 276 | 235 | 62 | 19 | −1600.45 | 1600.45 | −1619.07 | 14521 | 4611.3 | 4379.8 |
| s3 | 2356 | 759 | 1416 | 96 | 36 | −2221.89 | 2211.89 | 2268.45 | 20411.1 | 0452.2 | 9478.4 |
| s4 | >10000 | 390 | 4391 | 264 | 50 | −1804.55 | −1804.55 | −1841.09 | 29641.7 | 30066.9 | 28828.4 |

TABLE 10

| Effect of 3D Sampling Grid Size with PSP and PMP Together | | | | | | | | | | | | | | | |
|---|---|---|---|---|---|---|---|---|---|---|---|---|---|---|---|
| grid | Runtime (s) | | | | | RAT* (ps) | | | | | Power RAT* (fJ) | | | | |
| size | s5 | s6 | s7 | s8 | s9 | s5 | s6 | s7 | s8 | s9 | s5 | s6 | s7 | s8 | s9 |
| 100 × 100 × 100 | 256 | 478 | 1087 | 1616 | 2166 | 3308.44 | −3098.76 | −5032.37 | −4162.62 | −3970.82 | 32742.5 | 40957 | 51350.1 | 52721.9 | 57904.5 |
| 50 × 50 × 50 | 123 | 187 | 418 | 632 | 746 | 3308.44 | 3098.76 | 5031.65 | 4161.36 | −3992.34 | 32728.6 | 41099.5 | 51502.4 | 53263.5 | 57540.9 |
| 30 × 30 × 30 | 57 | 65 | 144 | 181 | 229 | 3318.38 | −3098.76 | −5074.29 | −4166.94 | −3982.08 | 32718.9 | 41477.7 | 50954.8 | 54483.2 | 58185.4 |
| 20 × 20 × 20 | 20 | 34 | 59 | 89 | 95 | −3352.38 | 3106.84 | 5133.14 | 4215.23 | −3986.63 | 32090.1 | 40488.1 | 51197.3 | 53758.6 | 59011.9 |
| 10 × 10 × 10 | 7 | — | — | — | — | −3453.23 | — | — | — | — | 32984.8 | — | — | — | |

TABLE 11

| Combine Sampling and Other Pruning Rules Together | | | | | | | | | | | | |
|---|---|---|---|---|---|---|---|---|---|---|---|---|
| | Runtime (s) | | | | RAT* (ps) | | | | Power RAT* (fJ) | | | |
| net | 3d | pmp + 3d | psp + 3d | psp + pmp + 3d | 3d | pmp + 3d | psp + 3d | psp + pmp + 3d | 3d | pmp + 3d | psp + 3d | psp + pmp + 3d |
| s1 | 15 | 2 | 3 | 1 | −1465.03 | −1464.02 | −1465.03 | −1460.2 | 13798.7 | 13074.8 | 13798.7 | 128 94 |
| s2 | 19 | 4 | 5 | 2 | 1619.07 | −1600.8 | −1619.65 | −1601.03 | 14379.8 | 4741.5 | 14250.2 | 14703.3 |
| s3 | 36 | 10 | 7 | 4 | −2268.45 | −2220.5 | −2240.24 | −2216.45 | 19478.4 | 20382.6 | 19873.7 | 20235.3 |
| s4 | 50 | 16 | 14 | 6 | 1841.09 | −1807.69 | −1823.48 | −1805.53 | 28828.4 | 8524.6 | 29296.8 | 30110.6 |
| s5 | 71 | 46 | 32 | 20 | 3513.18 | −3347.37 | 3442.74 | −3352.38 | 32510.9 | 32414 | 31169.5 | 32090.1 |
| s6 | 101 | 77 | 42 | 34 | 3271.83 | −3120.23 | −3166.29 | −3106.84 | 41617 | 39806 | 41858 | 40488.1 |
| s7 | 209 | 135 | 80 | 59 | −5612.88 | −5193.8 | −5521.22 | −5133.14 | 50677.2 | 49000.5 | 51586.4 | 51197.3 |
| s8 | 309 | 219 | 127 | 89 | −4539.6 | 4224.43 | −4516.63 | −4215.23 | 54986.8 | 5305.7 | 52654.1 | 53758.6 |
| s9 | 327 | 256 | 133 | 95 | −4293.49 | −4017.42 | −4281.42 | −3986.63 | 59291.9 | 8997.2 | 58436.7 | 59011.9 |
| ave | 128 | 85 | 49 | 34 | −3158.29 | −2999.58 | 3119.63 | −2986.38 | 35063.23 | 34694.1 | 34769.34 | 34943.24 |

TABLE 12-continued

| Dynamic Tree Update |
|---|
| 6. case 3: $p_{new} > p_{cur}$, $q_{new} < q_{cur}$, goto line 9 |
| 7. case 4: $p_{new} > p_{cur}$, $q_{new} > q_{cur}$, $\Phi_{cur} = \Phi_{cur} \rightarrow$ right |
| 8. $Set(\Phi_{junk}) = Set(\Phi_{junk}) \cup \{\Phi_{cur}\}$ |
| 9. $\Phi_{dom} = \Phi_{cur} \rightarrow$ left |
| 10. while $\Phi_{dom} \neq \phi$ |
| 11. case 1: $p_{new} < p_{dom}$, $Set(\Phi_{junk}) = Set(\Phi_{junk}) \cup \{\Phi_{dom}, T_{\Phi_{dom} \rightarrow right}\}$ $\Phi_{dom} = \Phi_{dom} \rightarrow$ left |
| 12. case 2: $p_{new} > p_{dom}$, $\Phi_{dom} = \Phi_{dom} \rightarrow$ right |
| 13. repeat line 9~12 with modific actions: i. exchange 'left' and 'right'; ii. replace $p_{new}$ and $p_{dom}$ with $q_{new}$ and $q_{dom}$; and iii. exchange '<' and '>' |

TABLE 13

Comparison of Runtime and Performance for Buffered Tree Construction (D-Tree vs. Fast dTree)

| Test case | | | Runtime (s) | | | | | RAT* (ps) | | Power (fJ) | | | |
|---|---|---|---|---|---|---|---|---|---|---|---|---|---|
| n # | s # | nl # | S-Tree | sTree | D-Tree | dTree | Unreduced | S-Tree | sTree | S-Tree | sTree | D-Tree | dTree |
| 97 | 2 | 36 | 0 | 0 | 0 | 0 | 0 | −223 | −224 | 1492 | 1492 | 1430 | 1430 |
| 165 | 3 | 142 | 19 | 1 | 102 | 5 | 8 | −604 | −608 | 3908 | 3456 | 3907 | 3456 |
| 137 | 4 | 82 | 44 | 2 | 297 | 8 | 23 | −582 | −583 | 3426 | 3426 | 3131 | 3131 |
| 261 | 5 | 162 | 2849 | 8 | 5088 | 37 | 65 | −532 | −533 | 4445 | 4355 | 3979 | 3989 |
| 235 | 6 | 143 | 5200 | 25 | 13745 | 115 | 193 | 397 | −399 | 4919 | 4718 | 4860 | 3718 |
| 426 | 10 | 267 | — | 2346 | — | 3605 | — | — | −625 | — | 7338 | — | 5915 |

What is claimed is:

1. An integrated circuit, comprising:

an interconnect fanout tree carrying a logic or clock signal and including a source node, a plurality of sink nodes, a plurality of Steiner nodes, and a plurality of candidate buffer nodes;

a connection topology between nodes wherein a source node is interconnected by wires to the plurality of sink nodes through a plurality of internal nodes; and at least one buffer, selected from buffers having multiple Vdd levels (multi-Vdd buffers), is inserted at selected candidate buffer nodes between said source and sink nodes within a given routing tree of said interconnect fanout tree;

wherein said multi-Vdd buffers are inserted without inclusion of level converters between buffers.

2. An integrated circuit as recited in claim 1, wherein said multi-Vdd buffers comprise either inverting or non-inverting buffers.

3. An integrated circuit as recited in claim 1, wherein said multi-Vdd buffers comprise dual-Vdd buffers.

4. An integrated circuit as recited in claim 1, wherein said multi-Vdd buffers are selected by a means for buffer insertion, or buffered tree generation, configured to select a buffer Vdd level, within a set of candidate Vdd buffer levels, to reduce power consumption within constraints of a required arrival time (RAT) and without necessitating inclusion of level converters.

5. An integrated circuit as recited in claim 1, wherein said multi-Vdd buffers are selected by a means for buffer insertion, or buffered tree generation, configured to select a buffer Vdd level, within a set of candidate Vdd buffer levels, to meet area constraints on both buffers and interconnects while minimizing a delay or a delay difference without necessitating inclusion of level converters.

6. An integrated circuit as recited in claim 1, wherein said multi-Vdd buffers are placed in said given routing tree so that buffers with lower Vdd are not placed along a routing path of the routing tree before buffers with higher Vdd.

7. An integrated circuit as recited in claim 1, wherein multi-Vdd buffers are inserted by a routing means configured to perform buffer insertion according to one or more techniques selected from the group of automatic design time reducing techniques consisting of pre-slack pruning (PSP), predictive min-delay pruning (PMP), 2D sampling, and 3D sampling.

8. An integrated circuit as recited in claim 1, wherein multi-Vdd buffers are inserted by a routing means configured to perform buffer insertion according to a combination of pre-slack pruning (PSP) and predictive min-delay pruning (PMP) followed by 3D sampling.

9. An integrated circuit as recited in claim 1, wherein multi-Vdd buffers are inserted by a routing means configured for using multi-Vdd buffered trees constructed for utilizing an escape grid reduction technique.

10. An integrated circuit as recited in claim 1, wherein multi-Vdd buffers are inserted by a routing means having a data structure for storing options while pruning, said data structure configured with a hash table indexed by capacitance.

11. An integrated circuit, comprising:

an interconnect fanout tree carrying a logic or clock signal and including a source node, a plurality of sink nodes, a plurality of Steiner nodes, and a plurality of candidate buffer nodes;

a connection topology between nodes wherein a source node is interconnected by wires to the plurality of sink nodes through a plurality of internal nodes to reduce power consumption within constraints of a required arrival time (RAT); and at least one buffer, selected from buffers having multiple Vdd levels (multi-Vdd buffers), is inserted at selected candidate buffer nodes between said source and sink nodes within a given routing tree of said interconnect fanout tree;

wherein said multi-Vdd buffers are placed in said given routing tree so that buffers with lower Vdd are not placed along a routing path of the routing tree before buffers with higher Vdd;

wherein multi-Vdd buffers are inserted by a routing means configured to perform buffer insertion according to one or more techniques selected from the group of routing overhead reducing techniques consisting of pre-slack pruning (PSP), predictive min-delay pruning (PMP), 2D sampling, and 3D sampling; and wherein insertion of level converters is not necessary between buffers in response to multi-Vdd buffer insertion.

12. An integrated circuit as recited in claim 11, wherein said multi-Vdd buffers comprise either inverting or non-inverting buffers.

13. An integrated circuit as recited in claim 11, wherein said multi-Vdd buffers comprise dual-Vdd buffers.

14. An integrated circuit as recited in claim 11, wherein multi-Vdd buffers are inserted by a routing means configured for using multi-Vdd buffered trees constructed for using an escape grid reduction technique.

15. An integrated circuit as recited in claim 11, wherein multi-Vdd buffers are inserted by a routing means having a data structure for storing options while pruning, said data structure configured with a hash table indexed by capacitance.

16. A method of optimizing a logic or clock interconnection tree, comprising:

generating an interconnection tree having a source node interconnected by wires to a plurality of sink nodes through a plurality of Steiner nodes and a plurality of candidate buffer nodes;

selecting a multi-Vdd buffer for insertion at a selected candidate buffer node within a given routing tree to reduce power consumption while reducing delay or delay difference;

inserting multi-Vdd buffers, by a computer, at selected candidate buffer nodes between said source and sink nodes within said given routing tree of said interconnect tree;

wherein multi-Vdd buffers are inserted in said given routing tree so that buffers with lower Vdd are not placed along a routing path of the routing tree before buffers with higher Vdd; and wherein said multi-Vdd buffers are inserted without inclusion of level converters between buffers.

17. A method as recited in claim 16, wherein said multi-Vdd buffers comprise either inverting or non-inverting buffers.

18. A method as recited in claim 16, wherein said multi-Vdd buffers comprise dual-Vdd buffers.

19. A method as recited in claim 16, wherein buffer insertion overhead is reduced by utilizing one or more overhead reduction techniques selected from the group of reduction techniques consisting of: pre-slack pruning (PSP), predictive min-delay pruning (PMP), 2D sampling, 3D sampling, and escape grid reduction.

20. A method as recited in claim 16, wherein memory overhead during buffer insertion is reduced by utilizing a data structure, configured with a hash table indexed by capacitance, for storing options while pruning.

* * * * *